US009525448B2

(12) United States Patent
Hsieh

(10) Patent No.: US 9,525,448 B2
(45) Date of Patent: Dec. 20, 2016

(54) SNAP-MOUNTED AND PLUGGABLE OPTOELECTRONIC MODULE

(71) Applicant: FINISAR CORPORATION, Sunnyvale, CA (US)

(72) Inventor: Cindy H. Hsieh, Los Altos, CA (US)

(73) Assignee: FINISAR CORPORATION, Sunnyvale, CA (US)

(*) Notice: Subject to any disclaimer, the term of this patent is extended or adjusted under 35 U.S.C. 154(b) by 0 days.

(21) Appl. No.: 14/719,154

(22) Filed: May 21, 2015

(65) Prior Publication Data

US 2015/0341066 A1 Nov. 26, 2015

Related U.S. Application Data

(60) Provisional application No. 62/001,626, filed on May 21, 2014.

(51) Int. Cl.
*G02B 6/36* (2006.01)
*H05K 7/20* (2006.01)
*H04B 1/38* (2015.01)
*H01S 5/183* (2006.01)
*H05K 7/02* (2006.01)
*G02B 6/42* (2006.01)
*H05K 1/02* (2006.01)
*G02B 6/38* (2006.01)

(52) U.S. Cl.
CPC .............. *H04B 1/38* (2013.01); *G02B 6/4261* (2013.01); *G02B 6/4268* (2013.01); *G02B 6/4292* (2013.01); *H01S 5/183* (2013.01); *H05K 1/0274* (2013.01); *H05K 7/02* (2013.01); *G02B 6/3885* (2013.01)

(58) Field of Classification Search
CPC ................... H05K 7/12; H05K 1/0274; H05K 2201/10121; G02B 6/3897; G02B 6/4261; G02B 6/4266–6/4273
See application file for complete search history.

(56) References Cited

U.S. PATENT DOCUMENTS

| 6,074,231 A * | 6/2000 | Ju | H01R 13/627 361/801 |
|---|---|---|---|
| 6,600,652 B2 * | 7/2003 | Chandran | H01L 23/4093 24/458 |
| 6,752,645 B2 * | 6/2004 | Nakamura | H01L 23/4093 257/E23.086 |
| 6,924,984 B2 * | 8/2005 | Lee | H01L 23/4093 165/185 |
| 6,962,192 B2 * | 11/2005 | Lee | H01L 23/4093 165/67 |

(Continued)

*Primary Examiner* — Robert J Hoffberg
(74) *Attorney, Agent, or Firm* — Maschoff Brennan

(57) ABSTRACT

An example embodiment includes a snap-mountable optoelectronic module. The module includes a frame, a cover, and a module latch. The frame includes two or more post blocks that each defines a module latch receiver. The cover is configured to at least partially enclose an inner assembly and includes a module latch recess. The module latch includes pivots and a latch portion. The pivots are received in the module latch receivers such that the module latch is configurable in an unlatched position and in a latched position. In the unlatched position, the latch portion is disengaged from the module latch recess. In the latched position, the latch portion is engaged with the module latch recess to retain the cover relative to the frame.

20 Claims, 16 Drawing Sheets

(56) References Cited

U.S. PATENT DOCUMENTS

| | | | | |
|---|---|---|---|---|
| 7,499,279 B2* | 3/2009 | Campbell | ............... | G06F 1/20 |
| | | | | 165/80.4 |
| 7,903,411 B2* | 3/2011 | Campbell | ............... | G06F 1/20 |
| | | | | 165/80.3 |
| 9,229,182 B2* | 1/2016 | Ishigami | ............ | G02B 6/4268 |
| 2015/0282303 A1* | 10/2015 | Hsieh | ................ | G02B 6/4272 |
| | | | | 359/811 |
| 2016/0062064 A1* | 3/2016 | Ishigami | ............ | G02B 6/4268 |
| | | | | 385/92 |
| 2016/0195684 A1* | 7/2016 | De Bruijn | ........... | G02B 6/3897 |
| | | | | 385/92 |

* cited by examiner

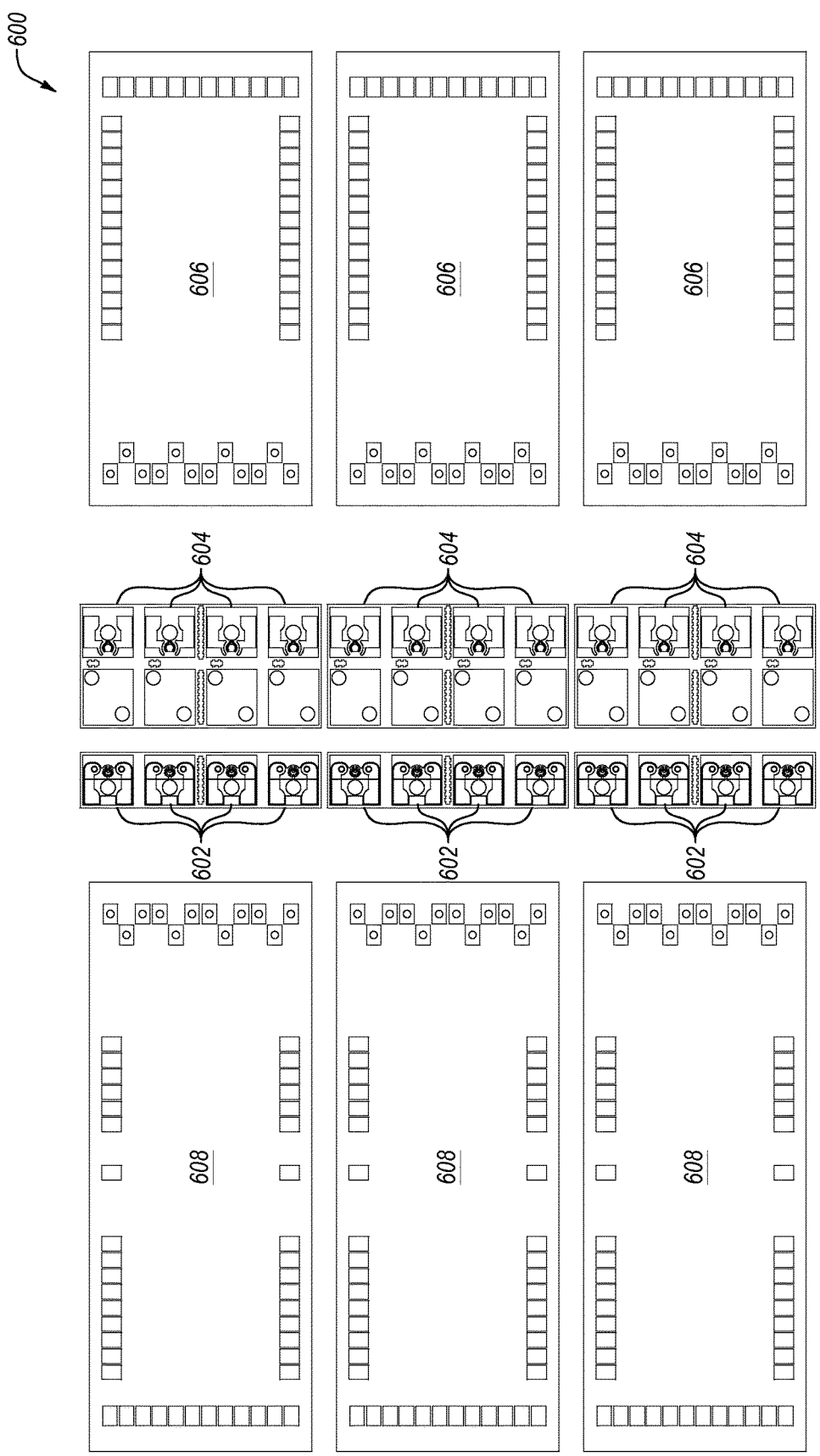

SNAP-MOUNTED AND PLUGGABLE OPTOELECTRONIC MODULE

RELATED APPLICATIONS

This application claims priority to and the benefit of U.S. provisional application No. 62/001,626, filed May 21, 2014, entitled SNAP-MOUNTED AND PLUGGABLE OPTOELECTRONIC MODULE, which is incorporated herein by reference in its entirety.

FIELD

Embodiments disclosed in this disclosure relate to optical components. In particular, some embodiments described in this disclosure relate to snap-mounted and pluggable optoelectronic modules.

BACKGROUND

Some data transmission involves the conversion of optical signals to electrical signals and/or electrical signals to optical signals. In some applications, the conversion occurs at a circuit board. For example, an optical cable carrying one or more optical signals may interface with an optoelectronic module such as a board-mounted optical engine. At the optical engine, the optical signals may be converted from optical signals to electrical signals using optical receivers. The electrical signals may then be communicated along etched copper traces integrated into the circuit board to a destination. Likewise, electrical signals may be communicated along copper traces to the board-mounted optical engine. At the board-mounted optical engine, the electrical signals may be converted to optical signals by optical transmitters. The optical signals may then be further communicated along the same or a different optical cable that interfaces with the optoelectronic module.

In some board-mounted optical engines, a lens assembly may be configured to receive an optical interface such as a pluggable cable connector. The optical interface generally supports one or more fiber optic cables that communicate the optical data to and from the board-mounted optical engine. When received in the lens assembly, alignment of the optical interface with respect to the lens assembly and retention of the optical interface within the lens assembly may help ensure proper communication of the optical data.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

An example embodiment includes an optoelectronic module (module). The module includes a frame, a cover, two or more posts, and a module latch. The frame includes two or more post blocks that are positioned at corners of the frame. The post blocks define a module latch receiver and a post receiver. The cover is configured to at least partially enclose an inner assembly. The cover includes a module latch recess. The posts are received in the post receivers and are configured to be positioned in post openings defined in a circuit board. The module latch includes pivots and a latch portion. The pivots are positioned in the module latch receivers such that the module latch is rotatable about the pivots relative to the frame. The module latch is configurable in an unlatched position in which the latch portion is disengaged from the module latch recess of the cover. The module latch is configurable in a latched position in which the latch portion is engaged with the module latch recess to retain the cover relative to the frame.

Another example embodiment includes a module. The module includes two or more posts, a stiffener assembly, a module latch, a frame, and a cover. The module latch includes pivots and a latch portion. The frame includes two or more post blocks positioned at corners of the frame. The post blocks are coupled to the posts. Each of the post blocks defines a module latch receiver that receives the pivots such that the module latch is rotatable about the pivots relative to the frame. The cover is configured to at least partially enclose the stiffener assembly. The cover includes a module latch recess. The module latch is configurable in an unlatched position in which the latch portion is disengaged from the module latch recess. The module latch is configurable in a latched position in which the latch portion is engaged with the module latch recess to retain the cover relative to the frame.

Another example embodiment includes a module. The module includes a frame, a cover, and a module latch. The frame includes two or more post blocks that each defines a module latch receiver. The cover is configured to at least partially enclose an inner assembly and includes a module latch recess. The module latch includes pivots and a latch portion. The pivots are received in the module latch receivers such that the module latch is configurable in an unlatched position and in a latched position. In the unlatched position, the latch portion is disengaged from the module latch recess. In the latched position, the latch portion is engaged with the module latch recess to retain the cover relative to the frame.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIG. 6 illustrates example transceiver components that may be implemented in the module of FIG. 1A;

DESCRIPTION OF SOME EXAMPLE EMBODIMENTS

Optical engines and other optoelectronic modules are generally secured to a circuit board with one or more screws or bolts. For example, screws or bolts may be used to secure a cover to the circuit board, to secure the module to the circuit board, and to secure one or more components to one another. However, use of the screws or bolts creates difficulties in assembly of optical modules to the circuit board and may increase part counts of modules and complexity of the modules.

Accordingly, some embodiments described herein relate to a snap-mounted and pluggable optoelectronic module (module or modules). The modules may be secured to a circuit board with snap-mountable fasteners, which are referred to herein as posts. An example embodiment includes an inner assembly that includes optical and electrical components. The modules include a frame that is secured to the circuit board in a snap-mount manner by the posts. The inner assembly is positioned within the frame. The frame includes two module latches that rotate relative to the frame. The module includes a cover that at least partially encloses the inner assembly and includes a module latch recess. The cover is positioned over the inner assembly and the module latches are rotated relative to the frame to latch the cover to the frame and secure the inner assembly to the circuit board.

Reference will now be made to the drawings to describe various aspects of some embodiments. The drawings are diagrammatic and schematic representations of the embodiments, and are not meant to be limiting, nor are they necessarily drawn to scale. Throughout the drawings, like numbers generally reference like structures unless described otherwise.

Figure 1A:
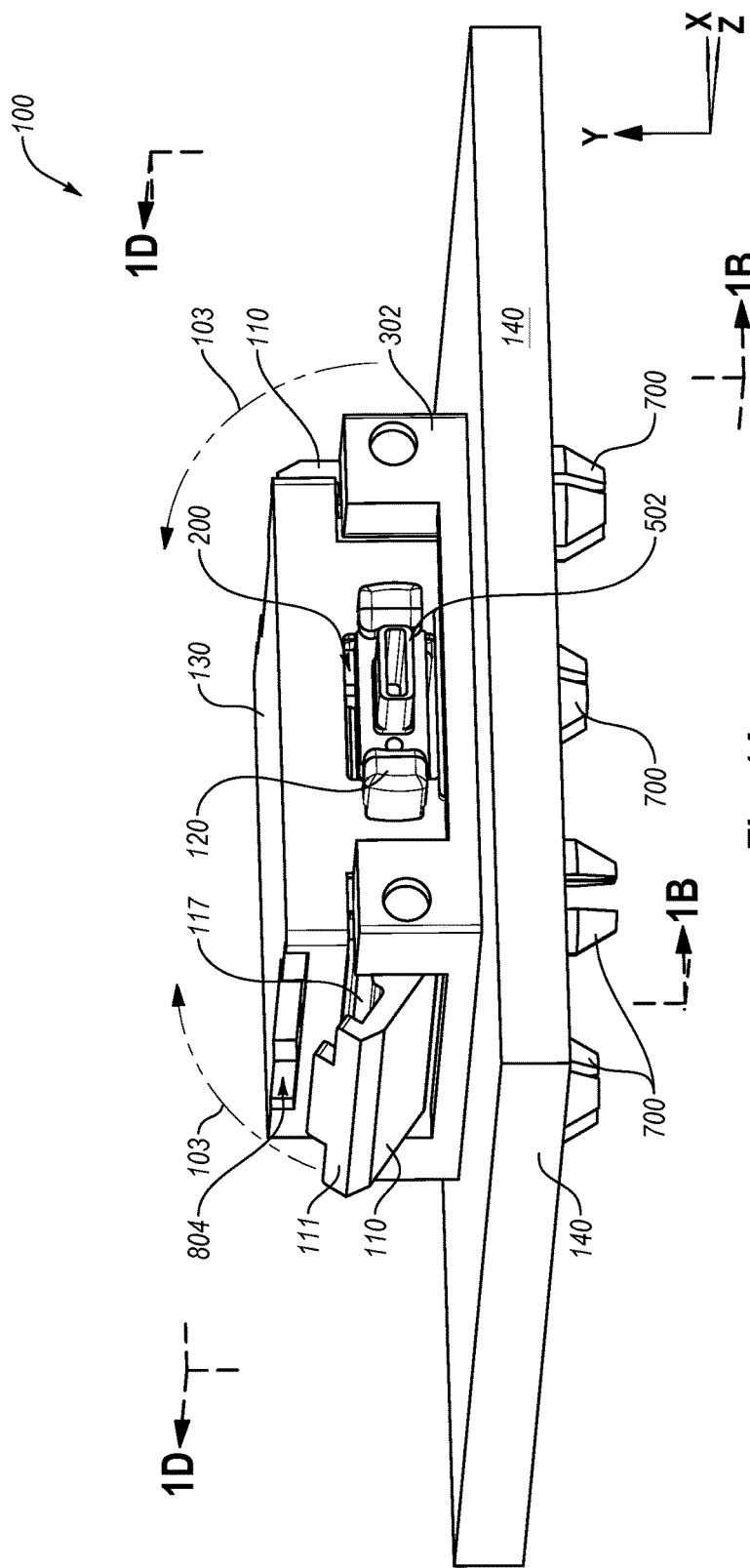
FIG. 1A illustrates an example optoelectronic module (module)
Figure 1B:
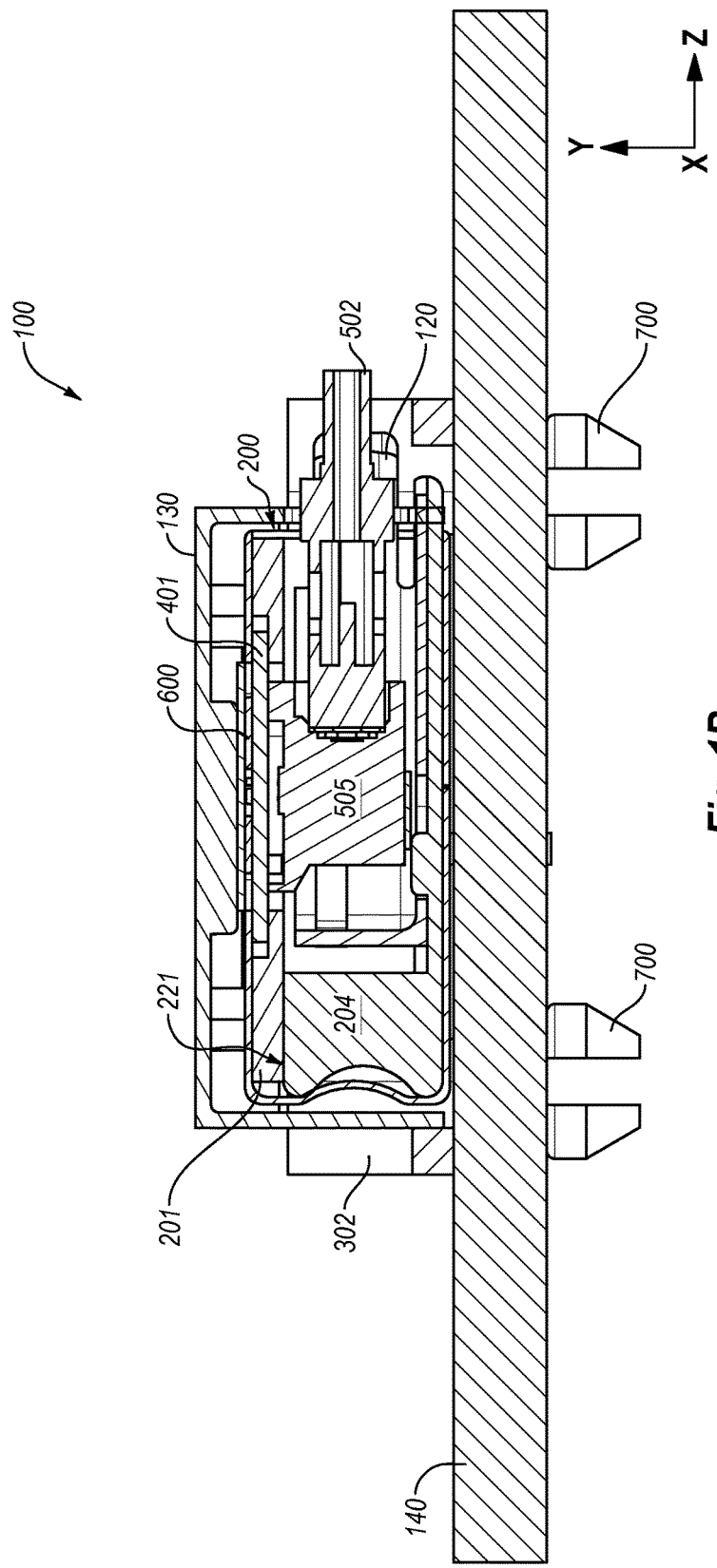
FIG. 1B illustrates another view of the module of FIG. 1A.
Figure 1C:
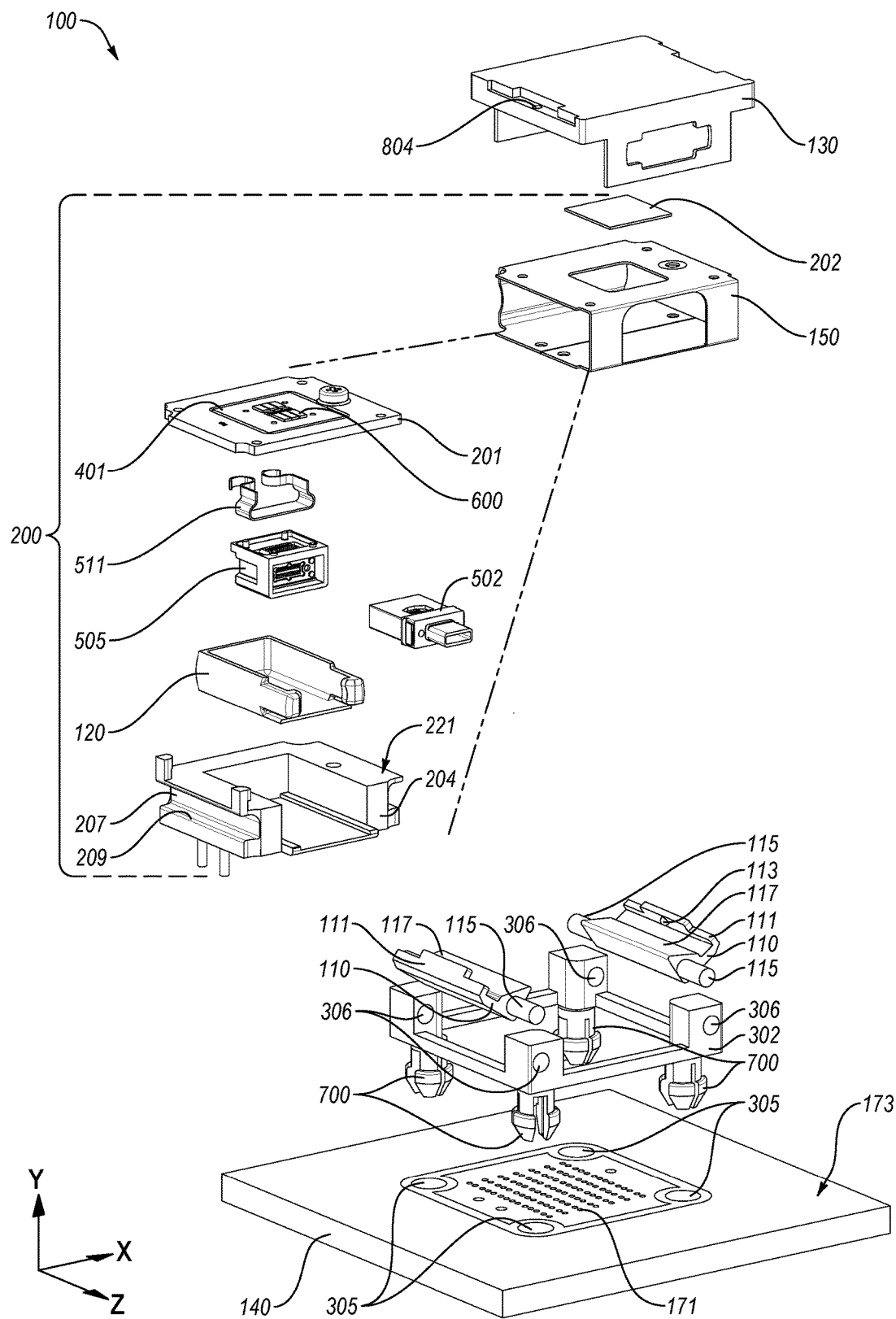
FIG. 1C illustrates another view of the module of FIG. 1A.
Figure 1D:
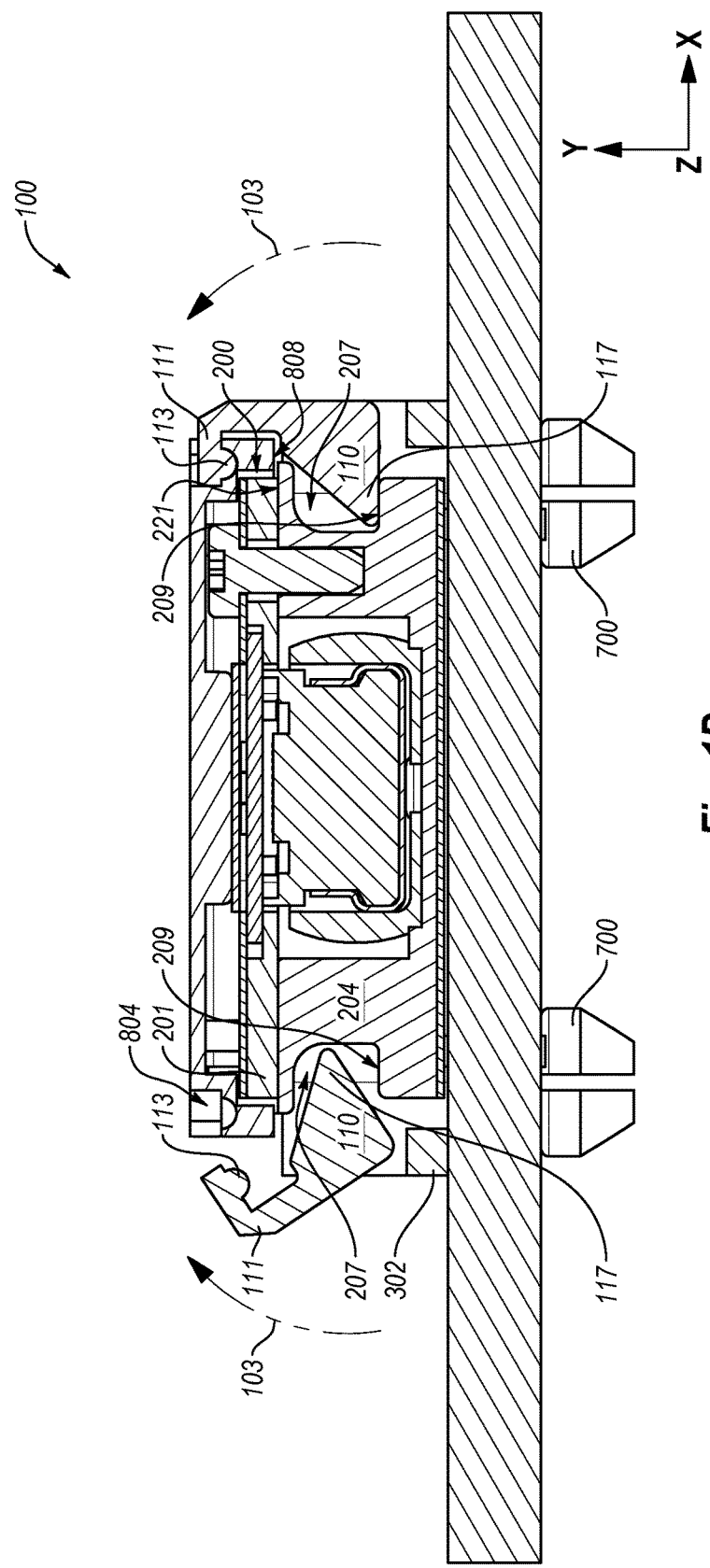
FIG. 1D illustrates another view of the module of FIG. 1A.

FIGS. 1A-1D illustrate an example optoelectronic module (module) 100. Specifically, FIG. 1A depicts an external view of the module 100. FIG. 1B depicts a sectional view of the module 100. FIG. 1C depicts a partially exploded view of the module 100. FIG. 1D depicts another sectional view of the module 100. The module 100 depicted in FIGS. 1A-1D includes an optical engine. An example of the module 100 may include an optical engine configured for high-speed (e.g., 25 gigabits per second (G) or higher) optical interconnects between integrated circuits and/or between circuit boards. Additionally or alternatively, the module 100 may be configured to receive twenty-four optical channels, one or more of which may be configured to communicate data.

The module 100 may include a snap-mounted module in which the module 100 is attached to a circuit board (board) 140 via snap-mount fasteners referred to as posts 700. Additionally, in the module 100 one or more components of an inner assembly 200 and a cover 130 are attached to the board 140 via snap-mount type attachment features. The attachment between the module 100 and the board 140 using posts 700 provides a permanent or semi-permanent attachment.

For example, in some embodiments the posts 700 may be attached to a frame 302. The posts 700 may be snap-mounted to the board 140 by pressing the posts 700 through post openings 305 (FIG. 1C only) defined in the board 140. The posts 700 may secure the frame 302 to the board 140. The inner assembly 200 is then positioned adjacent to and/or within the frame 302. A cover 130 or housing, which is configured to at least partially enclose the inner assembly 200, may be placed over the inner assembly 200. Module latches 110 may be rotatably coupled to the frame 302. The module latches 110 may latch to the cover 130, which may retain one or more of the components of the inner assembly 200 relative to the board 140.

With reference to FIGS. 1A and 1D, the module 100 is depicted in a partially assembled configuration. In the partially assembled configuration, the cover 130 is positioned over the inner assembly 200 such that the cover 130 encloses some portion of the inner assembly 200. The cover 130 is further positioned against the frame 302. The posts 700 are received in the post openings 305, which may attach the frame 302 to the board 140.

In FIGS. 1A and 1D, one of the module latches 110 is configured in an unlatched position and one of the module latches 110 is configured in a latched position. In particular, the left-most module latch 110 is illustrated in an unlatched position and the right-most module latch 110 is illustrated in a latched position. The unlatched position may include the module latch 110 at a first angular position relative to the frame 302. At the first angular position, a latch portion 111 of the module latch 110 is disengaged from a module latch recess 804.

To latch the cover 130, the module latches 110 may be rotated to a second angular position relative to the frame 302. For example, the module latches 110 may be rotated in a direction generally shown by arrows 103. When the module latches 110 are rotated to the second angular position, the latch portion 111 of the module latch 110 may engage a module latch recess 804 of the cover 130. When the cover 130 is in the latched position, the cover 130 is secured relative to the frame 302 and to the board 140. The right-most module latch 110 of FIG. 1A is illustrated in the latched position, as is the right-most module latch 110 of FIG. 1D.

The module 100 may be further configured to maintain engagement between a mechanical transfer (MT) connector 502 and one or more components of the inner assembly 200. For example, in FIGS. 1A and 1B, the MT connector 502 is depicted positioned within the module 100 and engaged with one or more components (e.g., lens 505) of the inner assembly 200. When positioned within the module 100, the MT connector 502 may be engaged in a lens 505, for example. An MT latch 120 may retain the MT connector 502 in the module 100 and maintain engagement between the MT connector 502 and the lens 505. The MT latch 120 may be included in the inner assembly 200 and thus positioned between the cover 130 and the board 140. Accordingly, in the module 100 of FIGS. 1A-1D, the module latches 110 and the frame 302 may secure the cover 130 and the inner assembly 200 to the board 140. In addition, the MT latch 120 may retain the MT connector 502 relative to the lens 505.

When the MT connector 502 is engaged with the lens 505, optical signals may be communicated from one or more optical fibers (not shown) held in the MT connector 502 to the lens 505. The lens 505 may redirect the optical signals to one or more transceiver (tx/rx) components 600. The tx/rx components 600 may convert the optical signals to electrical signals. The electrical signals may be communicated to electrical interconnects included in a glass 401, then to electrical interconnects included in a flex 150, and then to the board 140. Additionally, electrical signals that may originate at a host system or another circuit may be communicated from the board 140, to electrical interconnects included in the flex 150, to electrical interconnects in the glass 401, and to the tx/rx components 600. The tx/rx components 600 may convert the electrical signals to optical signals. The optical signals may be communicated through the lens 505 and to the optical fibers held in the MT connector 502 for transmission over one or more of the optical fibers.

Converting the optical signals to electrical signals and vice versa, as well as other processes, e.g., amplifying, modifying, etc., may generate heat. The heat or some portion thereof may be transferred to a thermal pad 202 and to the cover 130. The cover 130 may dissipate the heat to a surrounding environment.

In FIG. 1C, an example of the inner assembly 200 is depicted separated from the cover 130, the MT connector 502, the module latches 110, the frame 302, the posts 700, and the board 140. The inner assembly 200 may include the thermal pad 202, the flex 150, a top stiffener 201, the glass 401, the tx/rx components 600, a spring 511, the lens 505 and the MT latch 120. In other embodiments, the inner assembly 200 may omit one or more of the foregoing and/or may include one or more other components.

In the embodiment depicted in FIG. 1C, the module latch 110 may include pivots 115. The pivots 115 are configured to be received in module latch receivers 306 that are defined in the frame 302. The pivots 115 allow the module latch 110 to rotate relative to the frame 302. Rotation of the module latch 110 enables the module latch 110 to be configured in a latched position and an unlatched position.

The board 140 may define the post openings 305. The post openings 305 may be configured to receive posts 700 or a portion thereof. The board 140 of FIG. 1C includes four posts openings 305. In other embodiments, the board 140 may include one or more post openings 305. With the posts 700 attached to the frame 302 and the posts 700 positioned in the post openings 305, the frame 302 may be snap-mounted to the board 140.

The board 140 may include one or more bump pads 171 or another electrical connection/contact on a top surface 173 of the board 140. The bump pads 171 may be configured to communicate electrical signals to and from the tx/rx components 600 via the flex 150 and/or the lens 505.

With reference to FIGS. 1C and 1D, the module latch 110 may also include a cam feature 117. In addition, a bottom stiffener 204 may define cam recesses 207 that may include cam surfaces 209. As the module latches 110 rotate in a direction of the arrows 103, the module latches 110 may interface with the cam surfaces 209 of the cam recesses 207. The cam feature 117 may press on the cam surface 209 as the latch portion 111 engages the cover 130. As the cam feature 117 presses on the cam surface 209, the bottom stiffener 204 may be pressed towards the board 140. The lens 505, which may be positioned in the bottom stiffener 204, may additionally be pressed against the board 140. In the latched position, the cam feature 117 may contact the cam surface 209, which may retain the bottom stiffener 204 in a position relative to the board 140.

The flex 150 may be positioned between the bottom stiffener 204 and the board 140. The flex 150 may contact the board 140 or an interposer (not shown) may be placed between the flex 150 and the board 140. In embodiments including the interposer, the interposer may be compressible. Additionally or alternatively, the flex 150 may be compressible.

Figure 2A:
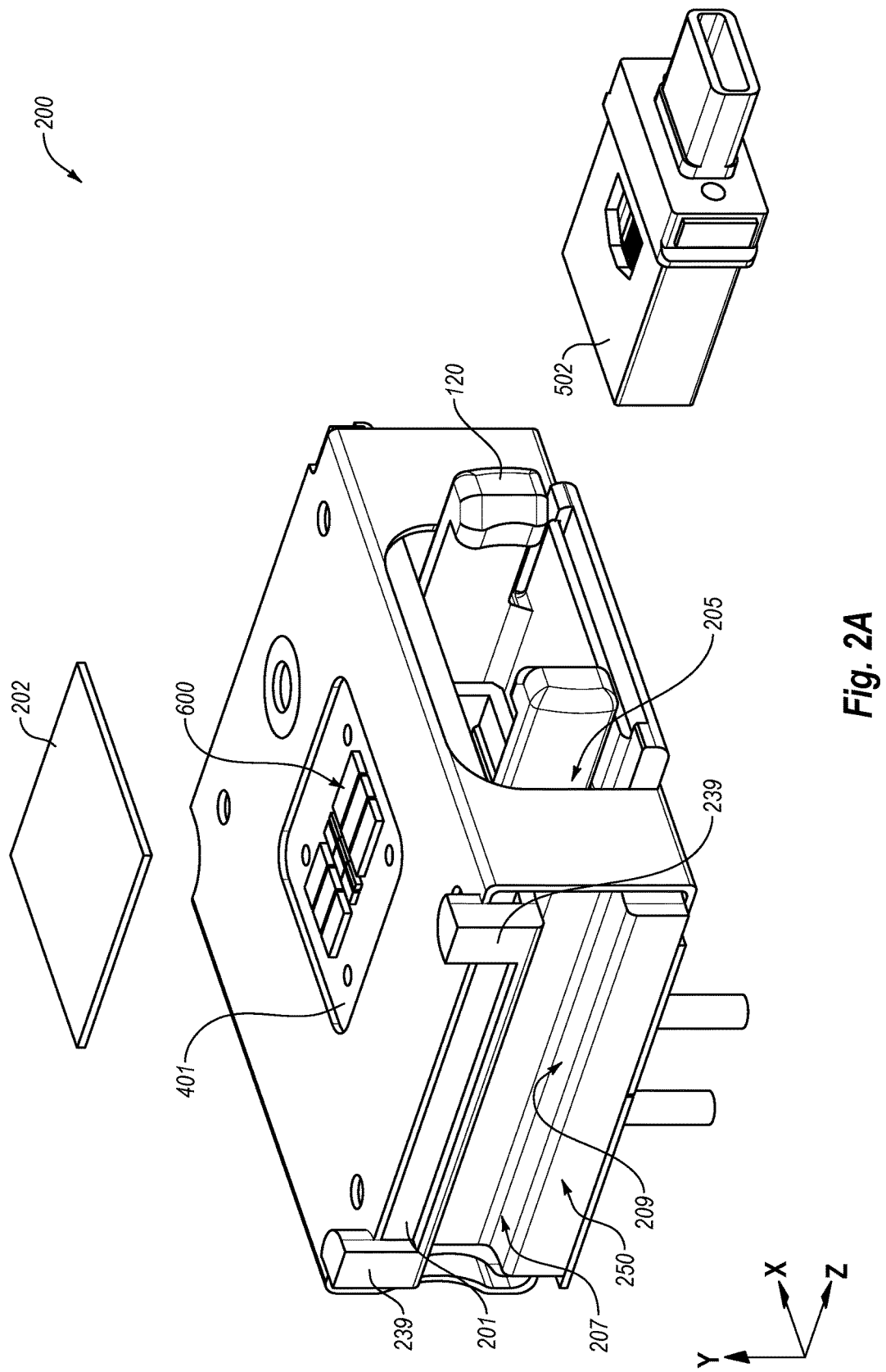
FIG. 2A illustrates an example inner assembly that may be implemented in the module of FIG. 1A.
Figure 2B:
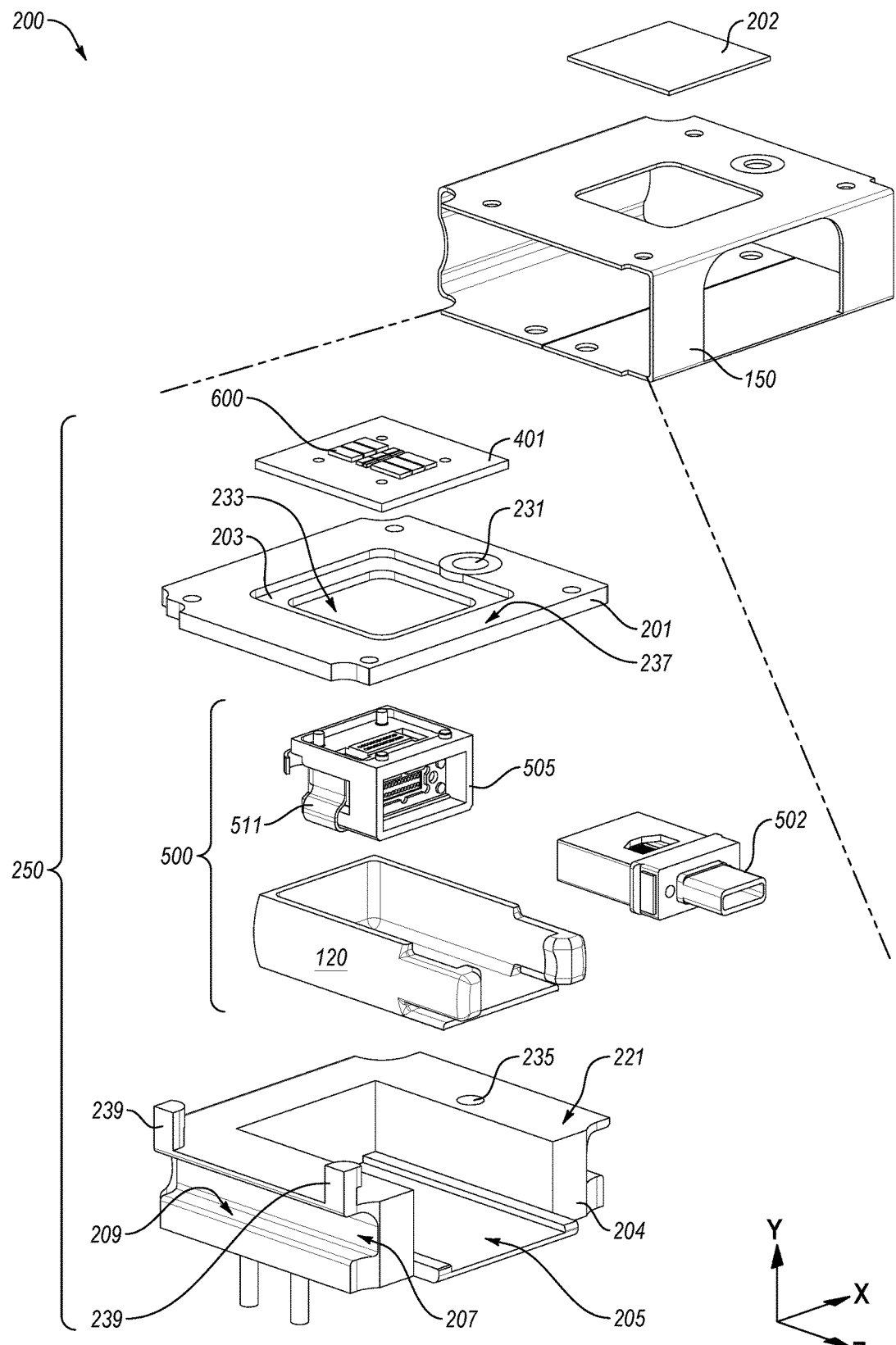
FIG. 2B illustrates another view of the inner assembly of FIG. 2A.

FIGS. 2A and 2B illustrate an example embodiment of the inner assembly 200 that may be implemented in the module 100 of FIGS. 1A-1D. FIG. 2A depicts the inner assembly 200 with the MT connector 502 separated from the inner assembly 200 and with the thermal pad 202 exploded from the flex 150. FIG. 2B depicts the inner assembly 200 with the thermal pad 202, the flex 150, the top stiffener 201, the MT connector 502, and the bottom stiffener 204 exploded from the lens 505, the MT latch 120, the tx/rx components 600, and the glass 401.

The inner assembly 200 may include a stiffener assembly 250. The stiffener assembly 250 may include the top stiffener 201 and the bottom stiffener 204. In FIG. 2A, the stiffener assembly 250 is depicted with the flex 150 partially wrapped around it. FIG. 2A depicts the stiffener assembly 250 with the top stiffener 201 attached to the bottom stiffener 204. FIG. 2B depicts the stiffener assembly 250 with the top stiffener 201 separate from the bottom stiffener 204.

The top stiffener 201 may be substantially rectangular and may define a component opening 233. The component opening 233 may enable optical signals to pass between the lens 505 (FIG. 2B only) and the tx/rx components 600, which may be positioned on the glass 401. The top stiffener 201 may include a glass surface 203. The glass surface 203 may extend around a border of the component opening 233. The glass 401 may be positioned on the glass surface 203. In the depicted embodiment, the glass surface 203 may be a portion of a total thickness of the top stiffener 201. The glass surface 203 may accordingly position a surface of the glass 401 on which the tx/rx components 600 are positioned at about the level of a top surface 237 of the top stiffener 201, or at a level above or below the level of the top surface 237.

The bottom stiffener 204 may define the cam recesses 207 that include the cam surfaces 209. As discussed with reference to FIGS. 1C and 1D, the module latches 110 may contact the cam surfaces 209 as they are rotated from an unlatched position to a latched position, which may press the stiffener assembly 250 towards a circuit board (e.g., the board 140).

In some embodiments, the top stiffener 201 may include a fastener opening 231 and the bottom stiffener 204 may include a fastener receiver 235 (FIG. 2B only). Additionally or alternatively, the bottom stiffener 204 may include one or more retainers 239. To assemble the top stiffener 201 with the bottom stiffener 204, the top stiffener 201 may be slid beneath (e.g., having a lower y-coordinate) the retainers 239. When the top stiffener 201 is positioned on the bottom stiffener 204, a fastener may be introduced through the fastener opening 231 and received in the fastener receiver 235.

The bottom stiffener 204 and the top stiffener 201 may define an MT assembly cavity 205. Before the top stiffener 201 is attached to the bottom stiffener 204, the MT plug assembly 500 (FIG. 2B only) or some portion thereof may be positioned in the MT assembly cavity 205. The top stiffener 201 may then be attached to the bottom stiffener 204. For example, in the depicted embodiment, the MT latch 120, the lens 505, and the spring 511 may be positioned in the MT assembly cavity 205. The top stiffener 201 may then be attached to the bottom stiffener 204. The glass 401 on which the tx/rx components 600 are positioned may then be positioned on the glass surface 203. The flex 150 may be wrapped at least partially around the stiffener assembly 250. The thermal pad 202 may then be positioned on the tx/rx components 600.

FIG. 2A depicts the thermal pad 202 exploded from the top stiffener 201 to expose the tx/rx components 600 and the glass 401. The thermal pad 202 may be positioned on the flex 150 and may contact one or more of the tx/rx components 600 or portions thereof. Contact between the thermal pad 202 and the tx/rx components 600 may result in transfer of heat produced in the tx/rx components 600 to the thermal pad 202 via conduction.

The tx/rx components 600 may be flip-chip bonded or otherwise mechanically and/or electrically coupled to the glass 401. One or more optical-related interconnects may also be embedded in glass 401. An advantage of having the tx/rx components 600 being flip-chip bonded to the glass 401 may include omission of wire bonds. Accordingly, the thermal pad 202 may contact the tx/rx components 600 directly. The glass 401 may also be bump padded to flex 150.

In some embodiments, the top stiffener 201 and/or the bottom stiffener 204 may be comprised of a material that is not a high-thermally conductive material. For example, the heat generated by the tx/rx components 600 may be transferred to the cover 130 of FIGS. 1A-1D via the thermal pad 202 rather than to the top stiffener 201 and/or the bottom stiffener 204.

Figure 3A:
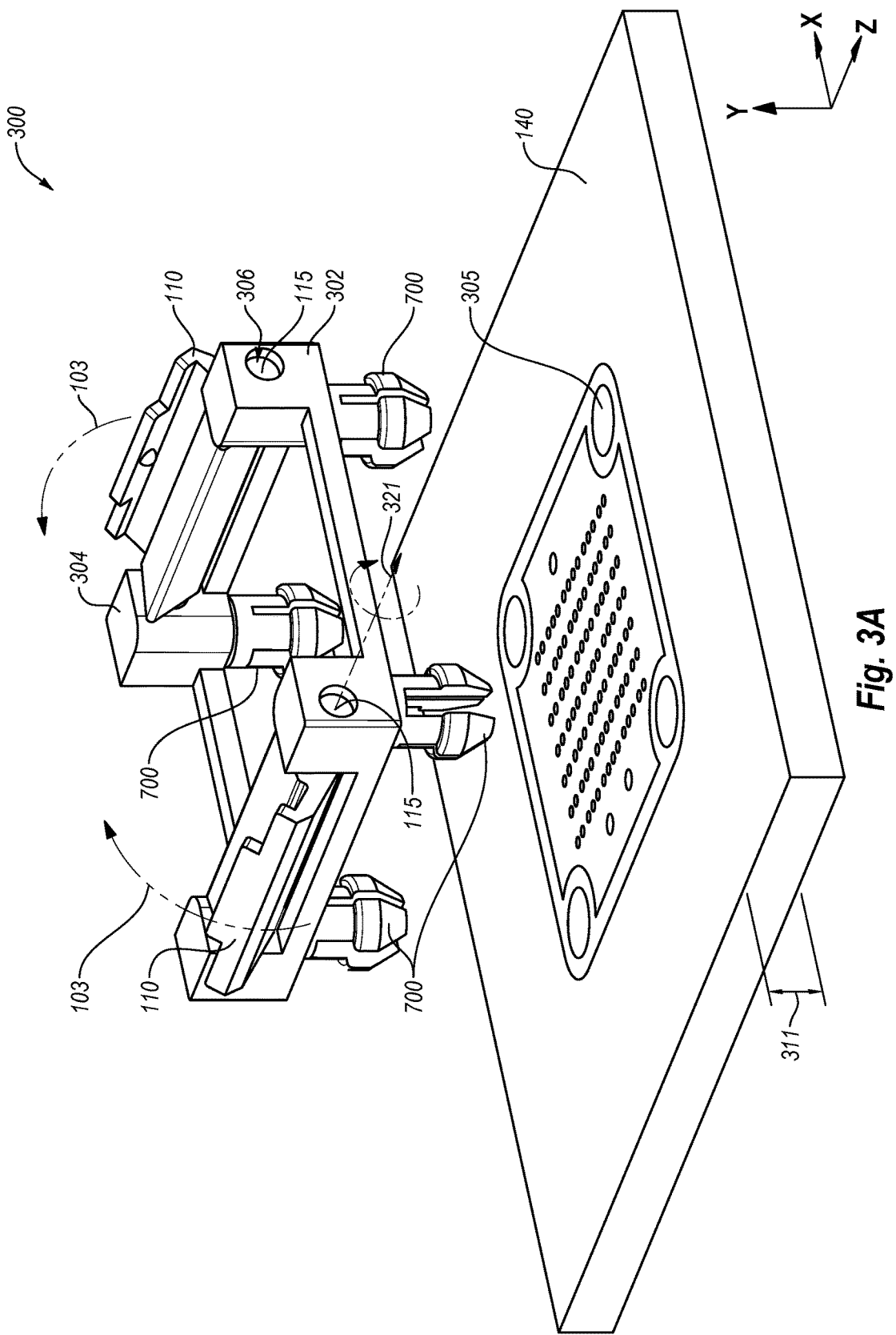
FIG. 3A illustrates an example frame assembly that may be implemented in the module of FIG. 1A.
Figure 3B:
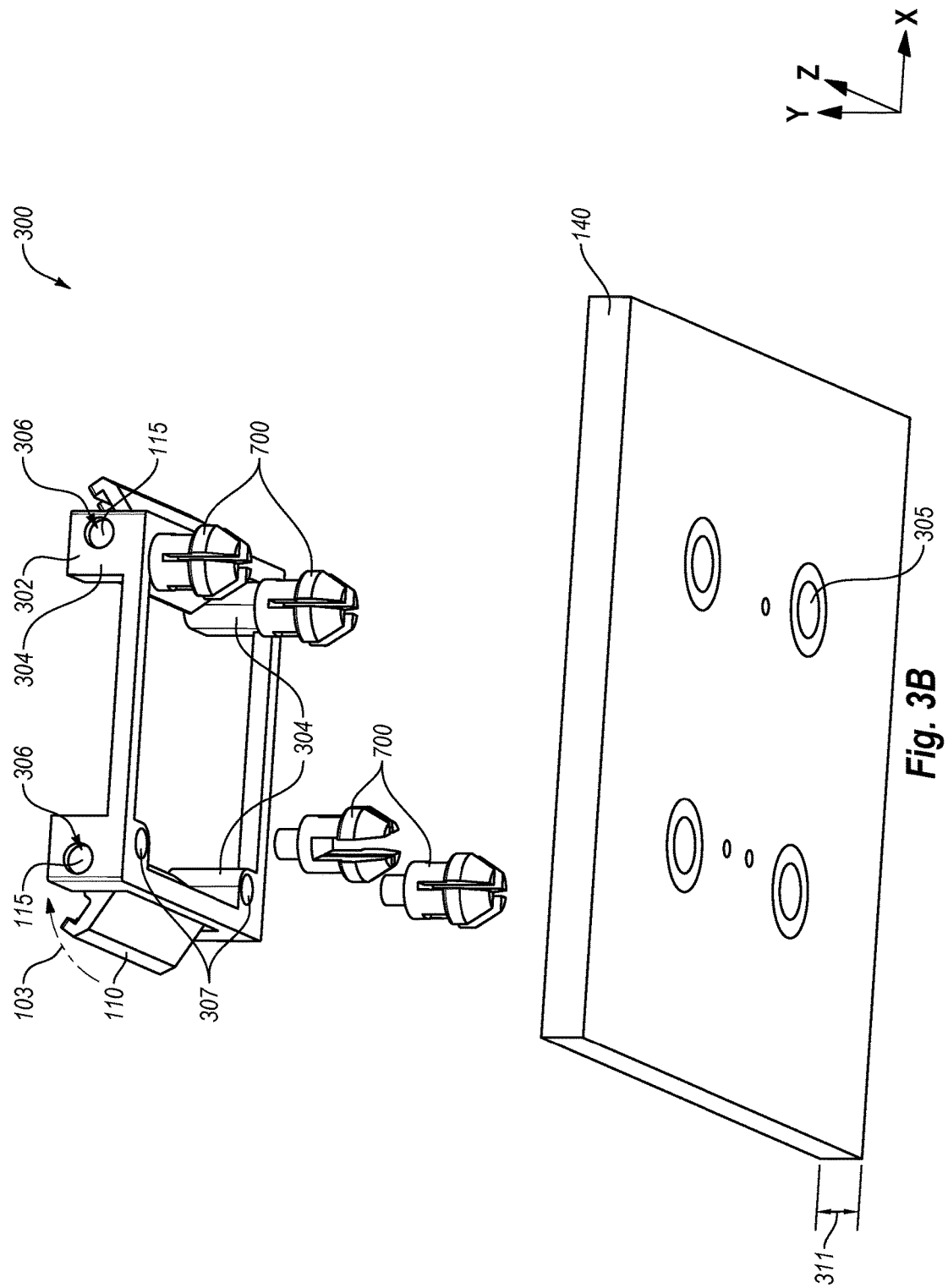
FIG. 3B illustrates another view of the frame assembly of FIG. 3B.

FIGS. 3A and 3B illustrate an example frame assembly 300 that may be implemented in the module 100 of FIGS. 1A-1D. The frame assembly 300 of FIGS. 3A and 3B is depicted with the board 140 and the module latches 110. FIG. 3A depicts the frame assembly 300 separated from the board 140 and FIG. 3B depicts the frame assembly 300 partially exploded and separated from the board 140. The frame assembly 300 generally secures the module latches 110 to the board 140.

The frame assembly 300 includes the frame 302 and the posts 700. In the depicted embodiment, the posts 700 are separate components that are attached to the frame 302. In some embodiments, the frame 302 may include integrated posts that are formed with the frame 302.

The frame 302 may include one or more post blocks 304. The post blocks 304 may be positioned at corners of the frame 302. Each of the post blocks 304 may define a module latch receiver 306 and a post receiver 307 (FIG. 3B only). The post receiver 307 may be configured to receive the posts 700. The module latch receivers 306 may be configured to receive a portion of the module latches 110. For example, the module latch receivers 306 may be configured to receive the pivots 115 of the module latches 110. When the pivots 115 are received in the module latch receivers 306, the module latches 110 are rotatable about the pivots 115 relative to the frame 302. For example, in FIG. 3A, the module latch 110 may rotate in a direction consistent with the arrow 103 and about axis 321.

In FIG. 3B, two of the posts 700 are depicted exploded from the frame 302. The posts 700 may be attached to the frame 302 by introducing a portion of the post 700 into the post receiver 307. For example, the posts 700 may include a threaded portion, which may be threaded into the post receiver 307 of the post blocks 304. The frame assembly 300, which may include the module latches 110, may be attached to the board 140 by pressing the posts 700 through the post openings 305. To release the frame 302 from the board 140, the posts 700 may be unthreaded from the frame 302. Additionally or alternatively, to release the frame 302 from the board 140, the posts 700 may be compressed and withdrawn from the post openings 305.

Figure 4:
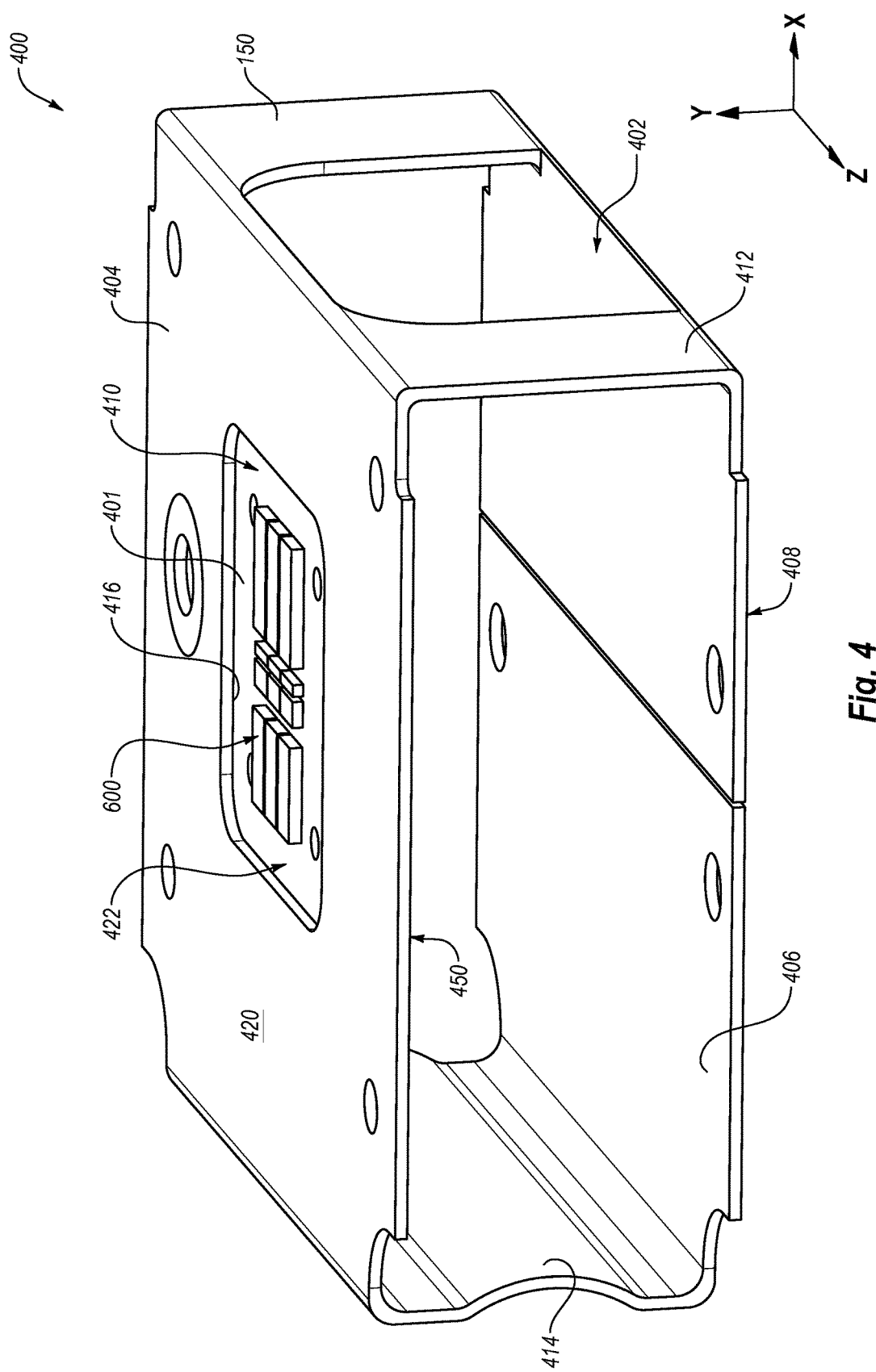
FIG. 4 illustrates a flex assembly that may be implemented in the module of FIG. 1A.

FIG. 4 illustrates a flex assembly 400 that may be implemented in the module 100 of FIGS. 1A-1D. With combined reference to FIGS. 1C and 4, the flex assembly 400 enables communication of electrical signals from the tx/rx components 600 to the bump pads 171 of the board 140. For example, the electrical signals may be representative of optical signals received via optical fibers held by the MT connector 502. Additionally or alternatively, the electrical signals may be communicated from a host device (not shown) or another circuit board to the tx/rx components 600 where the electrical signals are converted to optical signals and communicated via the optical fibers held by the MT connector 502.

Referring to FIG. 4, the flex assembly 400 may include the flex 150, the glass 401, and the tx/rx components 600. The flex 150 of FIG. 4 includes a top portion 404, a bottom portion 406, a front portion 412, and a rear portion 414. In some embodiments, the flex 150 may omit one or more of the top portion 404, the bottom portion 406, the front portion 412, and the rear portion 414. Additionally or alternatively, in some embodiments, the flex 150 may include one or more side portions.

The front portion 412 may define an MT opening 402. The MT opening 402 may be configured such that an MT connector (e.g., MT connector 502) may be engaged with and removed from a lens. For example, with reference to FIGS. 1A, 1C, and 4, the MT opening 402 may be configured such that the MT connector 502 may be introduced to the lens 505 and removed from the lens 505 with the module 100 in the partially assembled configuration of FIG. 1A.

Referring back to FIG. 4, the top portion 404 defines a component opening 410. The glass 401 may be mechanically and/or electrically coupled to a perimeter 416 of the component opening 410 or some portion thereof. For example, in the depicted embodiment, the glass 401 may be bump padded to an internal or bottom surface 450 of the top portion 404. In other embodiments, the glass 401 may be mechanically or electrically coupled to the flex 150 by another process and/or may be mechanically or electrically coupled at another location such as an outer or upper surface 420 of the top portion 404.

The flex 150 may include one or more electrical connections around the perimeter 416 of the component opening 410. The electrical connections may be configured to electrically couple to outer electrical connections of the glass 401. The electrical connections around the perimeter 416 may be electrically coupled to one or more electrical interconnects that are further coupled to electrical connections on the bottom portion 406 of the flex 150. For example, in some embodiments, the electrical interconnects run from the electrical connections around the perimeter 416, along or through the top portion 404, along or through the rear portion 414 and/or the front portion 412, and to electrical connections of the bottom portion 406. The electrical connections of the bottom portion 406 may be on a bottom surface 408 of the bottom portion 406. The electrical connections of the bottom portion 406 may be configured to align with and electrically couple to one or more bump pads or another type of electrical connection of a circuit board (e.g., board 140).

The tx/rx components 600 may be electrically and/or mechanically mounted to a top surface 422 of the glass 401. For example, in some embodiments, the tx/rx components 600 may be flip-chip bonded to the top surface 422 of the glass 401.

The glass 401 may include electrical interconnects that communicate electrical signals between the outer electrical connections of the glass 401 and the tx/rx components 600 positioned thereon. The glass 401 may also include one or more electrical interconnects that communicate electrical signals between one or more of the tx/rx components 600. Additionally or alternatively, the glass 401 may include optical interconnects. The optical interconnects may enable communication of optical signals between one or more of the tx/rx components 600 and/or other optical components of a module implementing the flex assembly 400 such as the lens 505 discussed elsewhere in this disclosure.

Accordingly, with combined reference to FIGS. 1C and 4, an electrical signal may be communicated from the bump pads 171 of the board 140 to electrical connections of the bottom portion 406 that are located on the bottom surface 408 of the flex 150. The electrical signals may be communicative via electrical interconnects of the flex 150 to outer electrical connections of the glass 401. The electrical signals may be communicated to one or more of the tx/rx components 600 via one or more electrical interconnects of the glass 401. Similarly, electrical signals may be communicated generally in reverse from the tx/rx components 600 to the bump pads 171 of the board 140.

The glass 401 may include a glass or a glass-like substrate. For example, the glass 401 may include any material that is substantially transparent or includes substantially transparent portions. For example, optical signals communicated by one or more of the tx/rx components 600 may pass through the glass 401 and electrical and/optical signals may be communicated along interconnects produced on the glass 401.

Figure 5A:
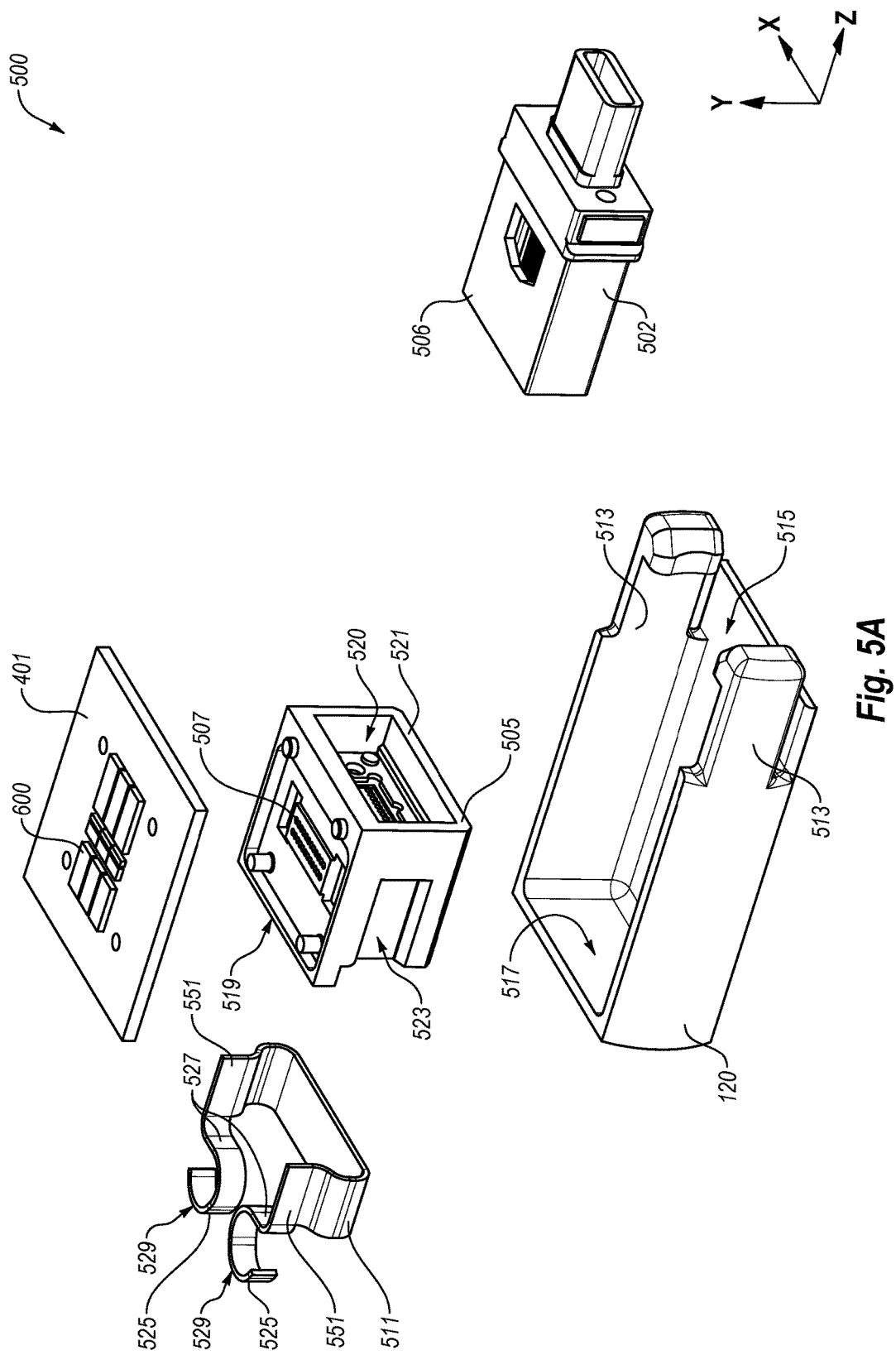
FIG. 5A illustrates an example MT plug assembly that may be implemented in the module of FIG. 1A.
Figure 5B:
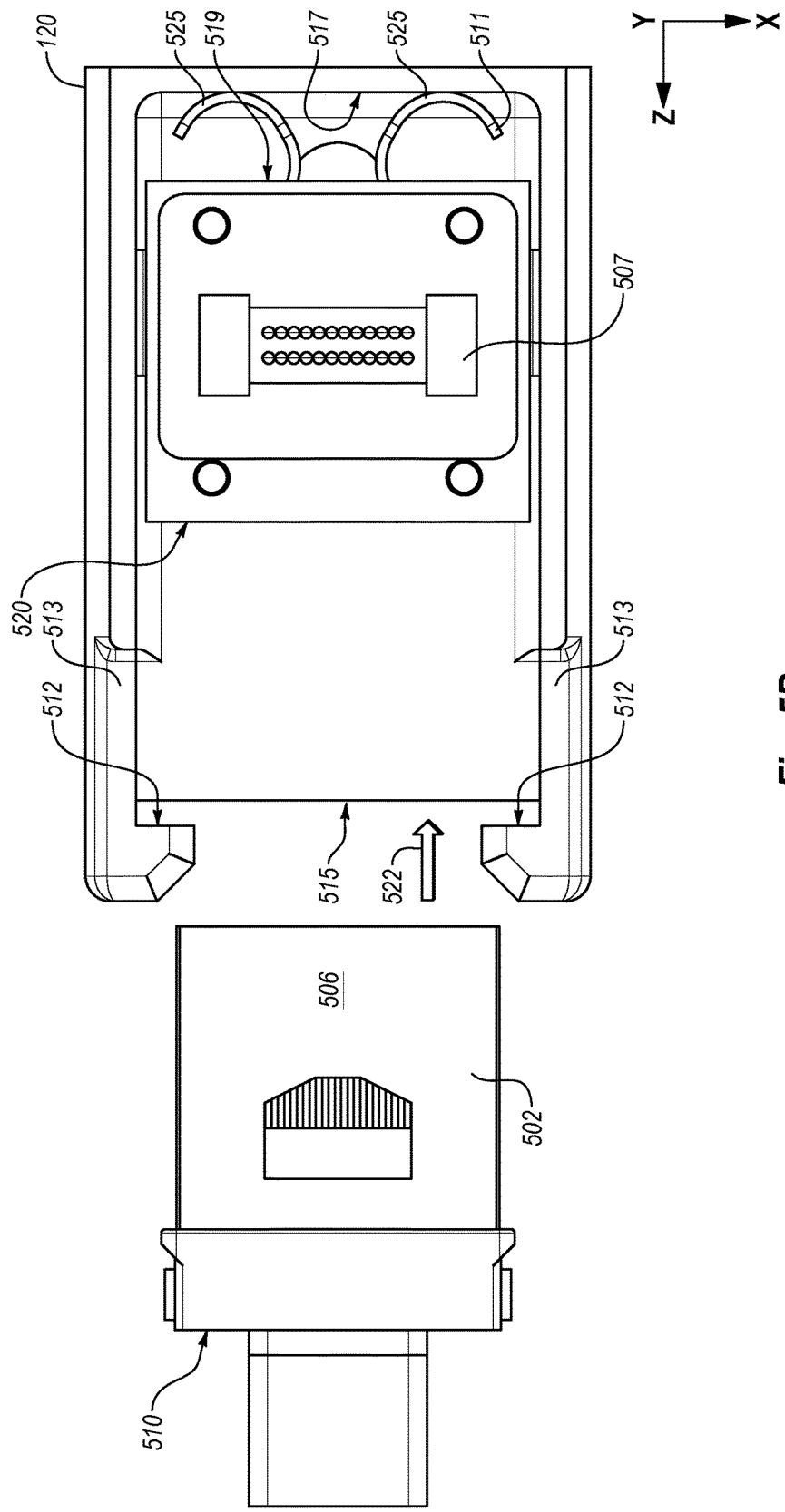
FIG. 5B illustrates another view of the MT plug assembly of FIG. 5A.
Figure 5C:
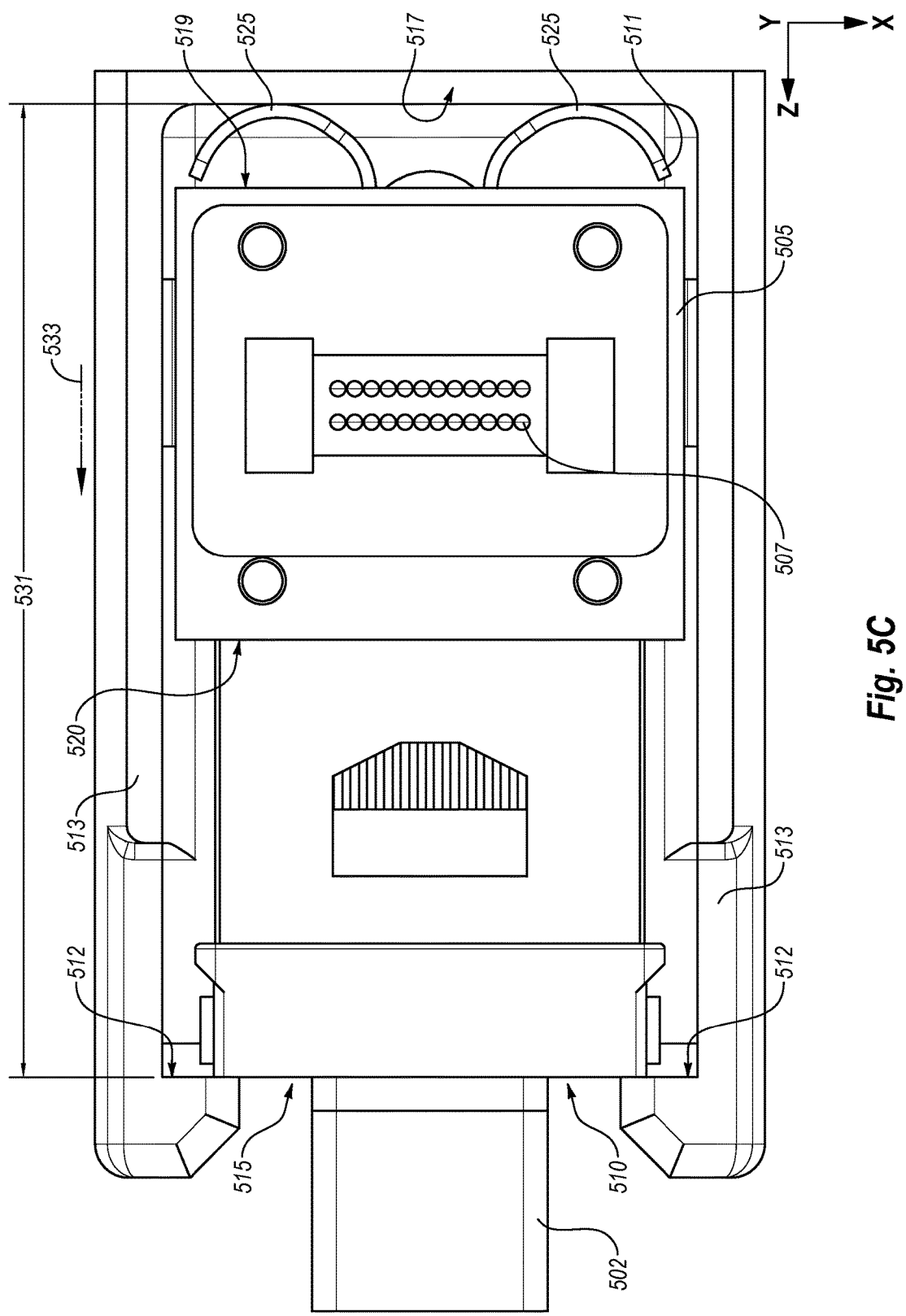
FIG. 5C illustrates another view of the MT plug assembly of FIG. 5A.

FIGS. 5A-5C illustrate an example MT plug assembly 500 that may be implemented in the module 100 of FIGS. 1A-1D. FIG. 5A depicts an exploded view of the MT plug assembly 500 with the glass 401 and tx/rx components 600. FIG. 5B depicts the MT plug assembly 500 with the MT connector 502 positioned outside the lens 505. FIG. 5C depicts the MT plug assembly 500 with the MT connector 502 received by the lens 505.

The MT plug assembly 500 may be configured to be received in an MT assembly cavity defined by a stiffener assembly. For instance, with combined reference to FIGS. 5A and 2B, the MT plug assembly 500 may be configured to be received in the MT assembly cavity 205.

Referring to FIGS. 5A-5C, the MT plug assembly 500 may position the lens 505 and the MT connector 502 relative to the tx/rx components 600. For example, when the MT connector 502 is received in the lens 505, optical signals carried on optical fibers held in the MT connector 502 may be communicated to the lens 505, which may further communicate the optical signals to the tx/rx components 600. Additionally, optical signals generated by one or more of the tx/rx components 600 may be communicated through the lens 505 and to optical fibers held by the MT connector 502 received by the lens 505.

The MT plug assembly 500 may include the MT latch 120, the spring 511, the lens 505, and the MT connector 502. The MT latch 120 may define a lens cavity 515. The lens cavity 515 may be configured to receive the lens 505, the spring 511, and the MT connector 502. The lens cavity 515 may include a rear interior surface 517. When the lens 505 and the spring 511 are received in the lens cavity 515, the spring 511 may press against the rear interior surface 517.

The MT latch 120 may include one or more retainer arms 513. The retainer arms 513 may plastically deform in the x-direction and/or the negative x-direction as the MT connector 502 is introduced into the MT latch 120. The retainer arms 513 may maintain the MT connector 502 engaged in the lens 505 as depicted in FIG. 5C.

With reference to FIG. 5A, the spring 511 may include two side portions 551. The side portions 551 may be configured to be received in a spring recess 523 of the lens 505. The spring 511 may also include spring arms 525. The spring arms 525 may each include a front surface 527 and a rear surface 529. The front surface 527 may contact a rear surface 519 of the lens 505 and the rear surface 529 may contact the rear interior surface 517 of the MT latch 120 when the lens 505 and the spring 511 are assembled and positioned in the lens cavity 515.

Referring to FIGS. 5A-5C, the lens 505 may also include an MT cavity 520. The MT cavity 520 may be defined at a first or front end 521 of the lens 505. In the depicted embodiment, the first end 521 is opposite the rear surface 519. The MT cavity 520 may be configured to receive a received portion 506 of the MT connector 502. The lens 505 may also include the spring recess 523 configured to receive the side portions 551 of the spring 511. For instance, the spring 511 may be slid (e.g., moved in a z-direction relative to the lens 505) onto the lens 505 such that a portion of the spring 511 is received in the spring recess 523 (FIG. 5A only) and the rear surface 519 of the lens 505 contacts the front surfaces 527 of the spring arms 525.

In the depicted embodiment, the lens 505 includes a lens array 507. The lens array 507 may be arranged such that when the glass 401 is positioned over (e.g., having a higher y-coordinate in FIGS. 5A-5C) the lens 505, the lens array 507 may communicate optical signals with one or more of the tx/rx components 600 positioned on the glass 401.

With reference to FIGS. 5B and 5C, the spring 511 may be assembled with the lens 505. The lens 505 with the spring 511 may then be positioned in the lens cavity 515 of the MT latch 120. The received portion 506 of the MT connector 502 may then be introduced into the lens 505.

For example, with reference to FIG. 5B, the MT connector 502 is depicted separated from the lens 505 and the MT latch 120. The MT connector 502 may include a front MT surface 510. The retainer arms 513 of the MT latch 120 may include an MT latch surface 512. An arrow 522 represents a direction the MT connector 502 may be moved relative to the MT latch 120 and the lens 505 to plug the MT connector 502 into the lens 505. As the MT connector 502 moves in the direction represented by arrow 522 and is introduced into the lens cavity 515, the retainer arms 513 may plastically deform in the x-direction and/or the negative x-direction. Movement of the MT connector 502 relative to the MT latch 120 and the lens 505 may continue in the direction represented by arrow 522 until the front MT surface 510 clears the MT latch surface 512 of the retainer arms 513 of the MT latch 120.

With reference to FIG. 5C, the MT connector 502 is depicted engaged with the lens 505. When engaged, the MT latch surface 512 contacts the front MT surface 510 of the MT connector 502. Additionally, when engaged, the spring 511 may be compressed between the lens 505 and the MT latch 120, which may press the lens 505 and the MT connector 502 against the MT latch surface 512. The MT latch 120 and the spring 511 may retain the MT connector 502 engaged in the lens 505.

In the depicted embodiment, the MT latch 120 includes a length 531 defined between the rear interior surface 517 and the MT latch surface 512. The length 531 may be defined such that the MT latch surface 512 retains engagement between the MT connector 502 and the lens 505. Additionally, the length 531 may be defined such that the spring 511 applies a spring force 533 against the lens 505 that presses the front MT surfaces 510 against the MT latch surface 512 of the retainer arms 513. The spring force 533 may be directed in substantially the z-direction and may be configured to properly position the lens 505 relative to the tx/rx components 600 of FIG. 5A.

FIG. 6 illustrates example embodiments of the tx/rx components 600 that may be implemented in the module 100 of FIGS. 1A-1D. The tx/rx components 600 may include one or more arrays of components used in converting optical signals to electrical signals and/or vice versa. Additionally, one or more of the tx/rx components 600 may include supplementary components that may be used with conversion components.

During operation, one or more of the tx/rx components 600 may generate heat. A portion of the heat generated by the tx/rx components 600 may be transferred via thermal conduction, convection, radiation, or some combination thereof, away from the tx/rx components 600. For example, as discussed elsewhere in this disclosure, positioning a thermal pad (e.g., the thermal pad 202) and/or a heat sink (e.g., the heat sink 814 discussed below) in contact with the tx/rx components 600 or some subset thereof, may result in transfer of some portion of the heat generated during operation to the thermal pad and/or the heat sink.

One or more of the tx/rx components 600 may be configured to communicate with one or more others of the tx/rx components 600. For example, the tx/rx components 600 may include one or more laser drivers 608, which may communicate electrical signals to one or more vertical-cavity surface-emitting lasers (VCSELs) 602. The VCSELs 602 may then emit an optical signal representative of or based on the electrical signal. Additionally or alternatively, one or more photodiodes 604 may communicate electrical signals representative of received optical signals to one or more trans-impedance amplifiers (TIAs) 606.

In some embodiments, the tx/rx components 600 or some subset thereof may be positioned on glass. For example, as depicted in FIG. 4, the tx/rx components 600 may be positioned on the glass 401. The electrical signals communicated by the photodiodes 604 and/or the laser drivers 608 may be communicated via electrical interconnects on the glass 401.

In the embodiment depicted in FIG. 6, the tx/rx components 600 are configured for 25 G duplex optical communication, e.g., 25 G outbound or tx optical communication and 25 G inbound or rx optical communication. In other embodiments, the tx/rx components 600 may be configured for optical communication at one or more other speeds. Additionally, in the depicted embodiment, the tx/rx components 600 include twelve each of the VCSELs 602 and the photodiodes 604. Accordingly, each of the VCSELs 602 may be configured to emit optical signals at about 2.08 G each, for a total of about 25 G, and each of the photodiodes 604 may be configured to receive optical signals at about 2.08 G each, for a total of about 25 G. Alternatively, some of the VCSELs 602 and/or the photodiodes 604 may be redundant spares that are inactive unless others of the VCSELs 602 and/or the photodiodes 604 fail or are inactivated. For example, ten of the VCSELs 602 may emit optical signals at about 2.5 G each and ten of the photodiodes 604 may receive optical signals at about 2.5 G each, while two of the VCSELs 602 and two of the photodiodes 604 are redundant spares that remain inactive unless a failure or failures occur.

More generally, in some embodiments, the tx/rx components 600 may include one or more VCSELs 602, one or more photodiodes 604, one or more other types of optical transmitters, one or more other types of receivers, or some combination thereof. Additionally, the tx/rx components 600 may include one or more other components used in signal conversion, amplification, and the like, or any combination thereof. For example, the tx/rx components 600 may include monitor photodiodes and the like.

Figure 7:
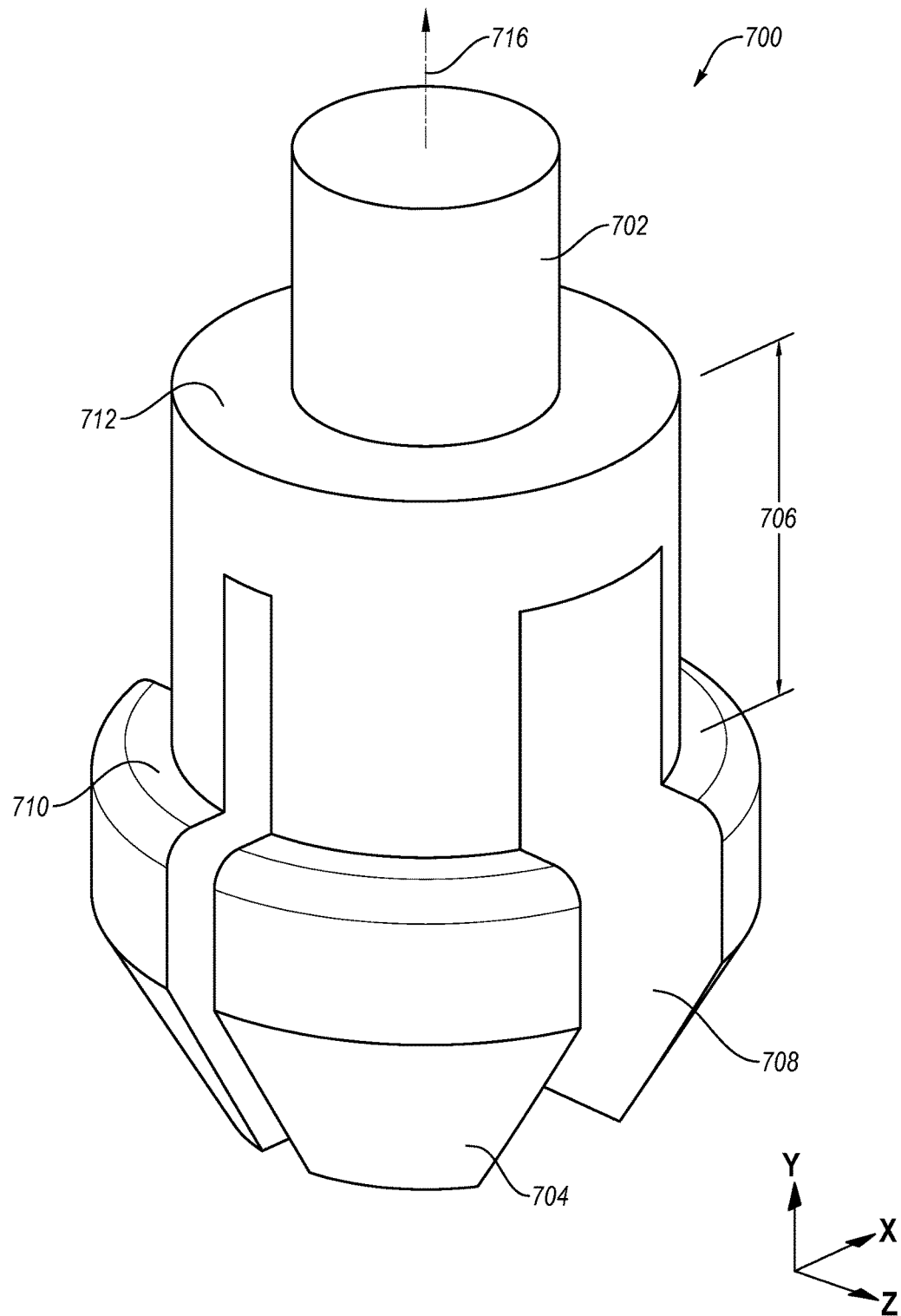
FIG. 7 illustrates an example post that may be implemented in the module of FIG. 1A.

FIG. 7 illustrates an example embodiment of the post 700 that may be implemented in the module 100 of FIGS. 1A-1D. In general, the post 700 is configured to be attached to a frame and to a circuit board. In some implementations, the post 700 is secured to and/or assembled with the frame and then the frame including the post 700 is further secured to the circuit board. In other embodiments, the post 700 is secured to and/or assembled with the circuit board and the frame is then secured to the post 700. Moreover, as discussed elsewhere in this disclosure, the post 700 may be integrally formed with the frame or the circuit board.

FIG. 7 depicts an embodiment of the post 700 that may be implemented in embodiments in which the frame is assembled with the post 700 and then the frame with the post 700 is secured to the circuit board. The post 700 includes a connector portion 702. The connector portion 702 may be configured to be received in a post block of a frame (e.g., the post block 304 of the frame 302). The connector portion 702 may be threaded in some embodiments. In other embodiments, the connector portion 702 may be press fit, adhered via an adhesive, or configured to be attached to the frame in any other suitable way.

The post 700 may include an upper surface 712 and a lower surface 710. An intermediate height 706 may be defined between the upper surface 712 and the lower surface 710. The intermediate height 706 may substantially correspond to a height of a circuit board into which the post 700 is introduced. For example, with combined reference to FIGS. 3A and 7, the intermediate height 706 may be substantially equal to a board height 311. By defining the intermediate height 706 to correspond to the board height 311, a module (e.g., the module 100 of FIGS. 1A-1D) may be held in a substantially fixed position relative to the board 140.

The post 700 may include flexible portions 708, which may include sloped portions 704. A maximum diameter of the flexible portions 708, e.g., at a location just below the lower surface 710, may in some embodiments be greater than a diameter of the post opening 305. When the post 700 is introduced into the post opening 305 and generally in a negative y-direction, the sloped portions 704 contact a perimeter of the post opening 305. As the post 700 is inserted through the post opening 305, the perimeter of the post opening 305 exerts an inward force, e.g., towards a central axis 716 of the post 700, on the sloped portions 704. In response, the flexible portions 708 flex inward towards the central axis 716, thereby compressing a diameter of the portion of the post 700 within the post opening 305. When the post 700 is pressed far enough, such that the lower surface 710 passes through the post opening 305 and clears a bottom surface of the board 140, the flexible portions 708 unflex towards their static unloaded positions to the extent permitted by a diameter of the post opening 305. That is, the flexible portions 708 may move outward away from the central axis 716 immediately after the lower surface 710 of the post 700 clears the bottom surface of the board 140.

Figure 8A:
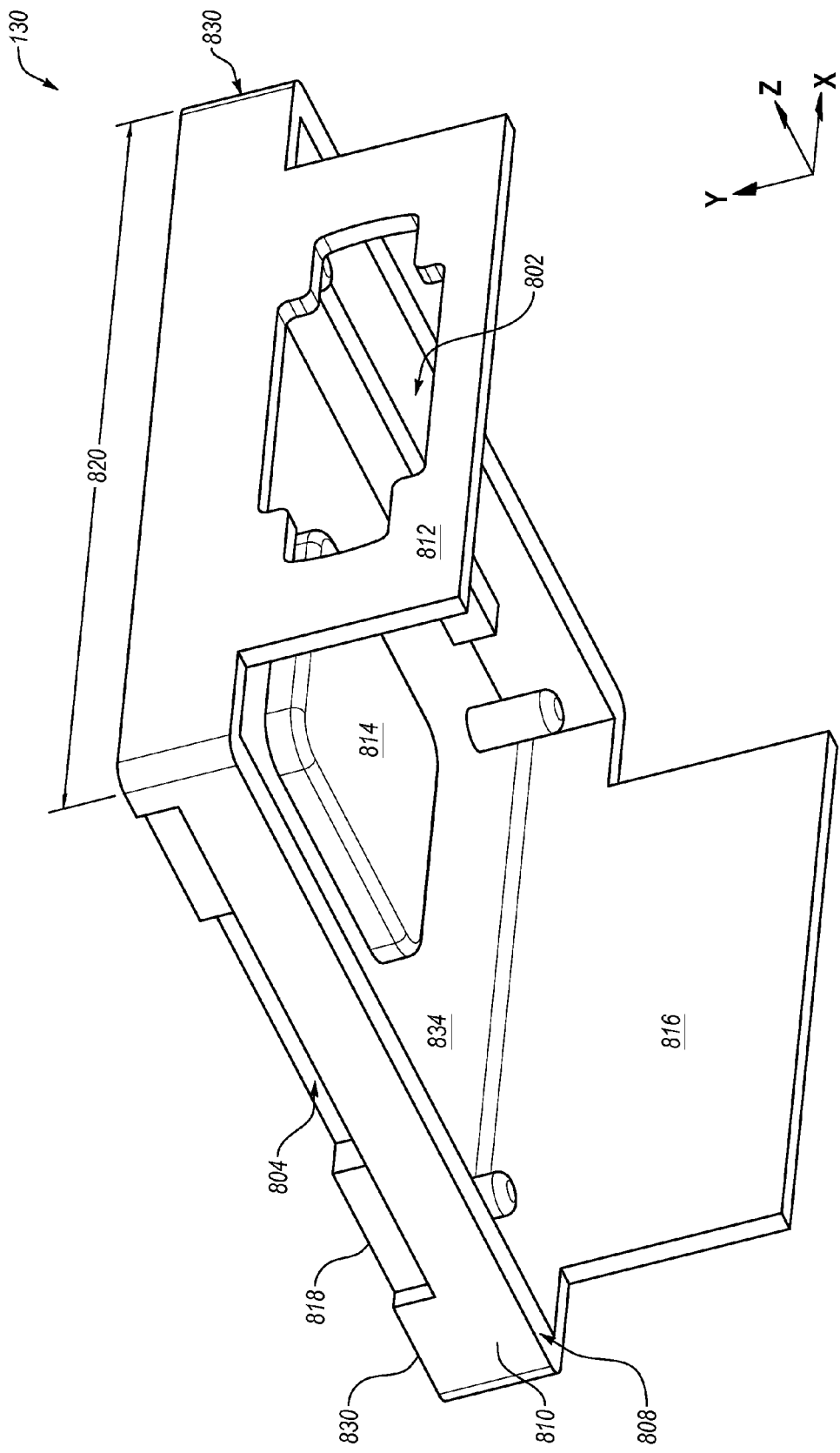
FIG. 8A illustrates an example cover that may be implemented in the module of FIG. 1A.
Figure 8B:
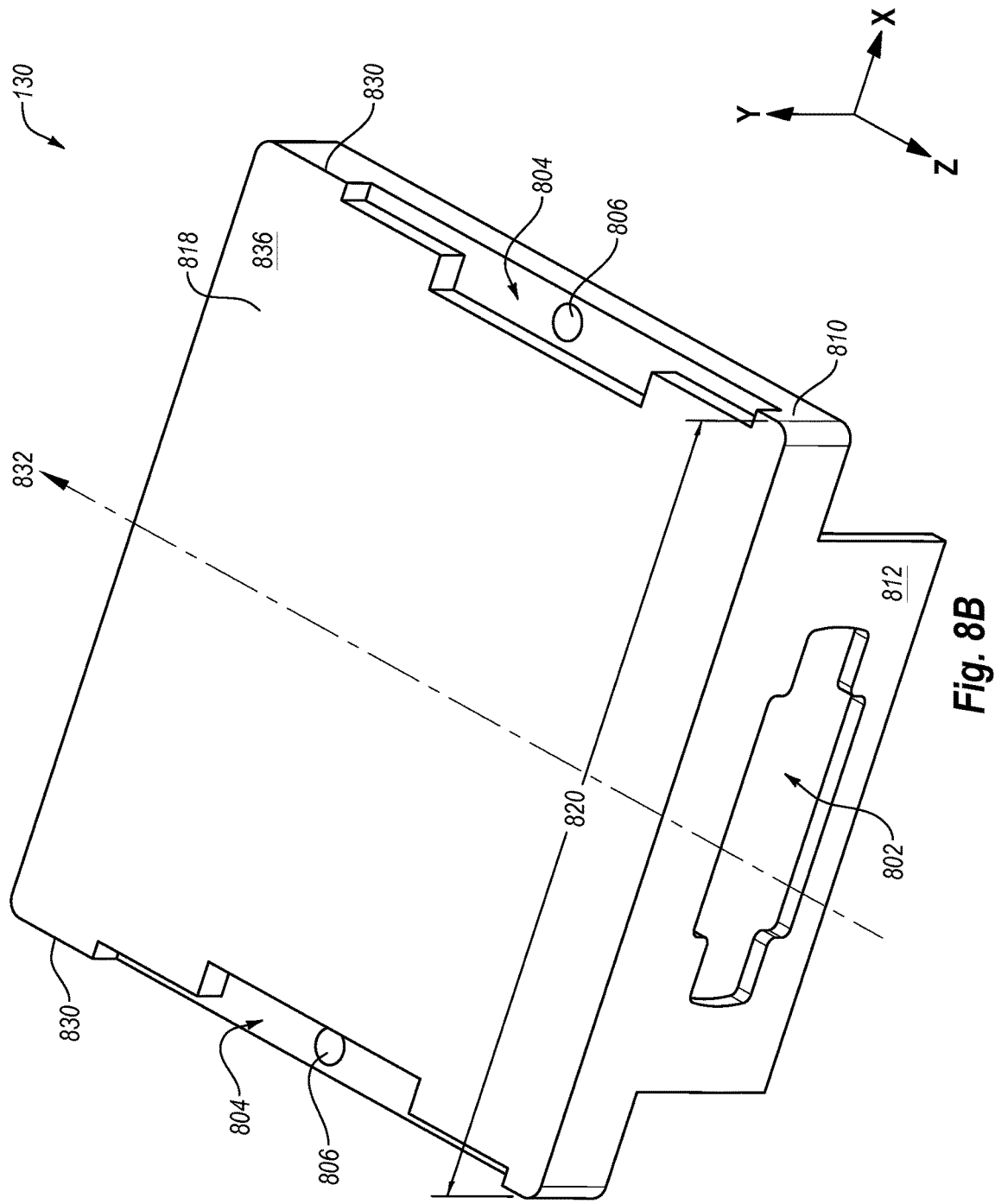
FIG. 8B illustrates another view of the cover of FIG. 8A.

FIGS. 8A and 8B illustrate an example embodiment of the cover 130 that may be implemented in the module 100 of FIGS. 1A-1D. In particular, FIG. 8A depicts a bottom perspective view of the cover 130 and FIG. 8B depicts a top perspective view of the cover 130. As discussed above, the cover 130 may be configured to at least partially enclose an inner assembly when secured to a circuit board (e.g., the board 140 discussed throughout this disclosure). More generally, the cover 130 may provide a structure that prevents or reduces contact with the inner assembly. Additionally, when secured to the circuit board and/or to the module 100 by a module latch (e.g., the module latch 110), the cover 130 helps to maintain the inner assembly against the circuit board.

The cover 130 depicted in FIGS. 8A and 8B include a rear portion 816 (FIG. 8A only), a front portion 812, and a top portion 818. The rear portion 816 and the front portion 812 generally extend in a negative y-direction from the top portion 818. The negative y-direction may generally correspond to a direction in which a board to which the cover 130 is to be secured may be positioned relative to the cover 130 during assembly of the cover 130.

The top portion 818 may include a border 810 around a perimeter of the top portion 818. The border 810 extends from the top portion 818 in the negative y-direction and may be included as a portion of the front portion 812 and the rear portion 816. The border 810 may extend over an upper (e.g., having a higher y-coordinate) portion of an inner assembly. For example, with reference to FIGS. 1B, 8A, and 8B, the border 810 may be sized such that a bottom surface 808 of the border 810 may contact a top surface 221 of the bottom stiffener 204.

The top portion 818 of the cover 130 may define one or more module latch recesses 804. The module latch recesses 804 are configured to receive and engage a latch portion of a module latch. For example, with combined reference to FIGS. 1A and 8B, the module 100 of FIG. 1A is shown with the right-most of the module latches 110 in an unlatched position in which the module latch 110 are not engaged with the module latch recesses 804 and one of the left-most of the module latches 110 in a latched position in which the module latch 110 are engaged with the module latch recesses 804. The module latches 110 may be rotated from an unlatched position to a latched position in which the latch portions 111 of the module latches 110 are engaged with the module latch recesses 804. The arrow 103 depicts a rotational position change that reconfigures the module latches 110 from an unlatched position to a latched position.

With reference to FIGS. 1D and 8B, in the depicted embodiment, the module latch recesses 804 include latch dimples 806. The latch dimples 806 are shaped to receive a latch bump 113 of the latch portions 111. Reception of the latch bumps 113 by the latch dimples 806 may increase engagement between the module latches 110 and the module latch recesses 804. For example, in embodiments including the latch dimples 806 and latch bumps 113, it may take more force to reconfigure the module latches 110 from a latched position to an unlatched position, than in embodiments not including the latch dimples 806 and the latch bumps 113.

In the depicted embodiment, the cover 130 includes two module latch recesses 804. The module latch recesses 804 are defined along two sides 830 of the cover 130. Additionally, in the depicted embodiment, the module latch recesses 804 are identical and symmetric with respect to a centerline 832 (FIG. 8B only) of the cover 130.

In some embodiments, the cover 130 may include one or more module latch recesses 804 that may include other shapes than that shown in FIGS. 8A and 8B. Additionally or alternatively, the latch dimples 806 and/or the latch bumps 113 may include different shapes or may be omitted. Additionally or alternatively, where two module latch recesses 804 are included, the module latch recesses 804 may not be identical and symmetric with respect to the centerline 832 of the cover 130 but may have different sizes/shapes and/or non-symmetric locations.

With reference to FIG. 8A, the top portion 818 may include a heat sink 814. The heat sink 814 may protrude from an inner surface 834 of the top portion 818. The heat sink 814 may generally extend in the negative y-direction. The heat sink 814 may be configured to contact a heat-generating component or a heat-transferring component to transfer heat or some portion thereof to the cover 130. After the heat is transferred to the cover 130, the heat may be dissipated to a surrounding environment. For example, the heat may be dissipated via a top surface 836 (FIG. 8B only) of the cover 130.

For example, with combined reference to FIGS. 8A, 8B, and 1C, the heat sink 814 may be configured to contact the thermal pad 202, which contacts the tx/rx components 600. Accordingly, a portion of the heat generated during operation of the tx/rx components 600 may transfer to the thermal pad 202, then to the heat sink 814. The heat may then be dissipated to a surrounding environment via the cover 130 and in particular, the top surface 836. In some embodiments, the thermal pad 202 may be omitted. In these and other embodiments, the heat sink 814 may directly contact one or more surfaces of the tx/rx components 600.

Referring back to FIGS. 8A and 8B, the front portion 812 and/or the rear portion 816 may not extend an entire length 820 of the top portion 818. For example, in the depicted embodiment, the front portion 812 and the rear portion 816 may extend along a central portion (e.g., including and surrounding the centerline 832) of the length 820 of the top portion 818. In some embodiments, the front portion 812 and the rear portion 816 may not extend the length 820 to provide clearance for post blocks (e.g., post blocks 304 of FIG. 3).

When a module implementing the cover 130 assembled, the front portion 812 and the rear portion 816 may extend over portions of an inner assembly positioned between the cover 130 and a circuit board. For example, with combined reference to FIGS. 1A, 8A, and 8B, the front portion 812 generally extends over a portion of the inner assembly 200. Similarly, although not explicitly shown in FIG. 1A, the rear portion 816 generally extends over another portion of the inner assembly 200.

The front portion 812 may define an MT opening 802. The MT opening 802 may be defined to enable access to components of the inner assembly 200 when the cover 130 is secured to the board 140. For example, the MT opening 802 may be defined such that an MT connector (e.g., the MT connector 502) may be introduced to the module 100.

In addition, with combined reference to FIGS. 5B, 8A, and 8B, the MT opening 802 may be configured to enable displacement of the retainer arms 513 of the MT latch 120 in an x-direction and/or negative x-direction. For example, when the MT connector 502 is introduced through the MT opening 802 and into the MT latch 120, the retainer arms 513 may flex to enable the MT connector 502 to be positioned within the MT latch 120. A size of the MT opening 802 may be sufficiently large to accommodate flexure of the retainer arms 513 during insertion and/or removal of the MT connector 502 from the module 100.

The present invention may be embodied in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module (module) comprising:
a frame that includes four or more post blocks that are positioned at corners of the frame, wherein each of the post blocks defines a module latch receiver and a post receiver;
a cover that is configured to at least partially enclose an inner assembly, wherein the cover includes a plurality of module latch recesses;
four or more posts that are each received in a respective one of the post receiver and configured to be positioned in post openings defined by a circuit board; and
a plurality of module latches that each includes pivots and a latch portion, wherein the pivots are positioned in the module latch receivers such that each of the module latches is rotatable about the pivots relative to the frame, and wherein the module latches are configurable in an unlatched position in which each latch portion is disengaged from a respective one of the module latch recesses of the cover and is configurable in a latched position in which the latch portion is engaged with the respective one of the module latch recesses to retain the cover relative to the frame.

2. The module of claim 1, wherein the inner assembly includes:
a bottom stiffener that defines a mechanical transfer (MT) assembly cavity configured to receive an MT plug assembly;
a top stiffener assembled with the bottom stiffener and defining a component opening bordered by a glass surface;
a glass that is positioned on the glass surface such that a portion of a first surface of the glass contacts the glass surface;
one or more transceiver (tx/rx) components positioned on a second surface of the glass that is opposite the first surface; and
a flex that at least partially surrounds the bottom stiffener assembled with the top stiffener.

3. The module of claim 2, wherein:
at least one of the module latches includes a cam feature;
the bottom stiffener defines at least one cam recess that includes a cam surface; and when the at least one of the module latches is configured in the latched position, the cam feature contacts the cam surface of the at least one of the cam recess.

4. The module of claim 2, wherein the MT plug assembly includes:
an MT latch that is configured to be received in the MT assembly cavity, wherein the MT latch includes one or more retainer arms;
a lens configured to receive a portion of an MT connector in an MT cavity defined at a first end of the lens; and
a spring that is positioned between a rear surface of the lens and a rear interior surface of the MT latch,
wherein:
the MT latch defines a lens cavity configured to receive the lens and the spring, and
the MT latch include a length defined such that when the MT connector is received in the lens, the spring applies a spring force against the lens that presses a front MT surface against an MT latch surface of the retainer arms.

5. The module of claim 2, further comprising a thermal pad, wherein:
the cover includes a heat sink;
the thermal pad is positioned in thermal contact between the tx/rx components and the heat sink; and
a portion of heat generated during operation of the tx/rx components transfers from the tx/rx components to the heat sink via the thermal pad.

6. The module of claim 2, wherein:
a lens is configured to communicate optical signals with the tx/rx components positioned on the glass;
the glass includes one or more electrical connections that electrically couple the tx/rx components with one or more outer electrical connections; and
the flex includes electrical interconnects that electrically couple the outer electrical connections of the glass and the electrical connections of the circuit board.

7. The module of claim 2, wherein the tx/rx components include one or more laser drivers, one or more vertical cavity surface emitting lasers (VCSELs), one or more photodiodes, or one or more trans-impedance amplifiers.

8. The module of claim 1, wherein the inner assembly includes tx/rx components configured for 25 gigabits per second optical communications.

9. An optoelectronic module (module) comprising:
four or more posts configured to be positioned at least partially in one or more post openings of a circuit board;
a stiffener assembly;
a plurality of module latches that each includes pivots and a latch portion;
a frame that includes four or more post blocks positioned at corners of the frame, wherein the post blocks are coupled to the posts and each of the post blocks defines a module latch receiver that receives a corresponding one of the pivots such that each of the module latches is rotatable about the pivots relative to the frame; and
a cover that is configured to at least partially enclose the stiffener assembly,
wherein:
the cover includes a plurality of module latch recesses;
each of the module latches is configurable in an unlatched position in which the latch portion is disengaged from a respective one of the module latch recesses; and
each of the module latches is configurable in a latched position in which the latch portion is engaged with the respective one of the module latch recesses to retain the cover relative to the frame.

10. The module of claim 9, wherein:
at least one of the module latches includes a cam feature;
the stiffener assembly defines at least one cam recess having a cam surface;
in the unlatched position, the cam feature is disengaged from the cam recess; and
in the latched position, the cam feature contacts the cam surface of the cam recess.

11. The module of claim 10, wherein the stiffener assembly includes a bottom stiffener that is assembled with a top stiffener and that defines a mechanical transfer (MT) assembly cavity that is configured to receive an MT plug assembly.

12. The module of claim 9, further comprising:
one or more transceiver (tx/rx) components; and
a glass positioned on the stiffener assembly,
wherein:
the tx/rx components are positioned on the glass,
the glass includes one or more outer electrical connections, and the glass includes one or more electrical interconnects configured to electrically couple at least some of the tx/rx components with one or more of the outer electrical connections.

13. The module of claim 12, further comprising a flex that includes electrical interconnects that electrically couple the outer electrical connections of the glass with one or more electrical connections of the circuit board.

14. The module of claim 12, further comprising a thermal pad positioned on a surface of one or more of the tx/rx components opposite the glass, wherein the cover includes a heat sink that contacts the thermal pad such that a portion of heat generated during operation of the tx/rx components transfers to the heat sink via the thermal pad.

15. The module of claim 9, further comprising an MT latch that is configured to be received within the stiffener assembly, wherein the MT latch includes one or more retainer arms each having an MT latch surface and wherein the MT latch includes a length defined such that the MT latch surface retains engagement between an MT connector and a lens that is positioned at least partially within a lens cavity defined by the MT latch.

16. A snap-mountable optoelectronic module comprising:
a frame that includes four or more post blocks that each define a module latch receiver;
a cover that is configured to at least partially enclose an inner assembly and that includes a plurality of module latch recesses; and
a plurality of module latches that each includes pivots and a latch portion, wherein the pivots are received in the module latch receivers such that the plurality of module latches are configurable in an unlatched position in which the latch portions are disengaged from the module latch recesses and are configurable in a latched position in which the latch portions are engaged with the module latch recesses to retain the cover relative to the frame.

17. The module of claim 16, further comprising four or more posts, wherein: the post blocks each define post receivers that are configured to receive a first portion of the posts; and the posts each include a second portion that is configured to be received in a post opening defined in a circuit board.

18. The module of claim 16, wherein: the pivots are configured such that the module latches are rotationally secured to the frame; the latched position includes each of the module latches in a first angular position relative to the frame; and the unlatched position includes each of the module latches in a second angular position relative to the frame, the second angular position different than the first angular position.

19. The module of claim 16, wherein:
the cover is configured to at least partially enclose a stiffener assembly,
each of the module latches includes a cam feature;
the stiffener assembly defines a plurality of cam recesses each having a cam surface;
in the unlatched position, each cam feature is disengaged from a respective one of the cam recesses; and
in the latched position, each cam feature contacts the cam surface of a respective one of the cam recesses to retain the stiffener assembly against a circuit board.

20. The module of claim 16, further comprising the inner assembly that is at least partially retained by the cover, wherein the inner assembly includes:
a bottom stiffener that at least partially defines a mechanical transfer (MT) assembly cavity configured to receive an MT plug assembly;
a top stiffener assembled with the bottom stiffener and that defines a component opening bordered by a glass surface;
a glass that is positioned on the glass surface such that a portion of a first surface of the glass contacts the glass surface;
one or more transceiver (tx/rx) components positioned on a second surface of the glass that is opposite the first surface; and
a flex that at least partially surrounds the bottom stiffener assembled with the top stiffener.

\* \* \* \* \*